United States Patent
Ausserlechner

(10) Patent No.: US 10,502,588 B2
(45) Date of Patent: Dec. 10, 2019

(54) MAGNETIC POSITION SENSOR

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 346 days.

(21) Appl. No.: 15/429,422

(22) Filed: Feb. 10, 2017

(65) Prior Publication Data
US 2017/0241803 A1    Aug. 24, 2017

(30) Foreign Application Priority Data

Feb. 19, 2016 (DE) .......................... 10 2016 102 978

(51) Int. Cl.
*G01D 5/14*     (2006.01)
*G01D 5/245*    (2006.01)

(52) U.S. Cl.
CPC ............. *G01D 5/14* (2013.01); *G01D 5/2451* (2013.01)

(58) Field of Classification Search
CPC .......... G01D 5/14; G01D 5/142; G01D 5/145; G01D 5/16; G01D 5/2013; G01D 5/2046; G01D 5/485; G01R 15/20; G01R 33/07; G01R 33/09; G01R 33/18; G01B 7/00; G01B 7/02; G01B 7/30; G01B 21/16
See application file for complete search history.

(56) References Cited

U.S. PATENT DOCUMENTS

| | | | |
|---|---|---|---|
| 6,545,463 B1 | 4/2003 | Dettmann et al. | |
| 8,415,946 B2 | 4/2013 | Bartos et al. | |
| 9,354,084 B2 | 5/2016 | Ausserlechner et al. | |
| 2003/0099067 A1* | 5/2003 | Farahat ................ | G11B 5/5526 360/264.3 |
| 2007/0075673 A1* | 4/2007 | Nakazawa ............. | H02K 21/14 318/712 |
| 2009/0206827 A1* | 8/2009 | Aimuta ................. | G01D 5/145 324/207.25 |

(Continued)

FOREIGN PATENT DOCUMENTS

DE      102006060622 A1    6/2008

OTHER PUBLICATIONS

Ausserlechner, U. "Inaccuracies of Anisotropic Magneto-Resistance Angle Sensors Due to Assembly Tolerances." Progress in Electromagnetics Research B, vol. 40, 79-99, 2012. 21 pages.

(Continued)

*Primary Examiner* — Son T Le
(74) *Attorney, Agent, or Firm* — Eschweiler & Potashnik, LLC

(57) ABSTRACT

A device includes a permanent magnetic material extending along a path, a first magnetic angle sensor configured to output at least a first signal and being positioned remotely from the material, and a second magnetic angle sensor configured to output at least one second signal and being positioned remotely from the material and from the first magnetic angle sensor. Based on the at least one first signal and the at least one second signal, a relative positioning of the first magnetic angle sensor and the second magnetic angle sensor with respect to the material in parallel to the path is determined. The magnetization of the material has a periodicity that varies along the path.

25 Claims, 16 Drawing Sheets

(56) References Cited

U.S. PATENT DOCUMENTS

2009/0284252 A1    11/2009  Burgdorf et al.
2014/0375312 A1*   12/2014  Friedrich ............... G01P 3/489
                                                       324/259

OTHER PUBLICATIONS

Ausserlechner, Udo. "The Optimum Layout for Giant Magneto-Resistive Angle Sensors." IEEE Sensors Journal, vol. 10, No. 10, Oct. 2010. 12 pages.

* cited by examiner

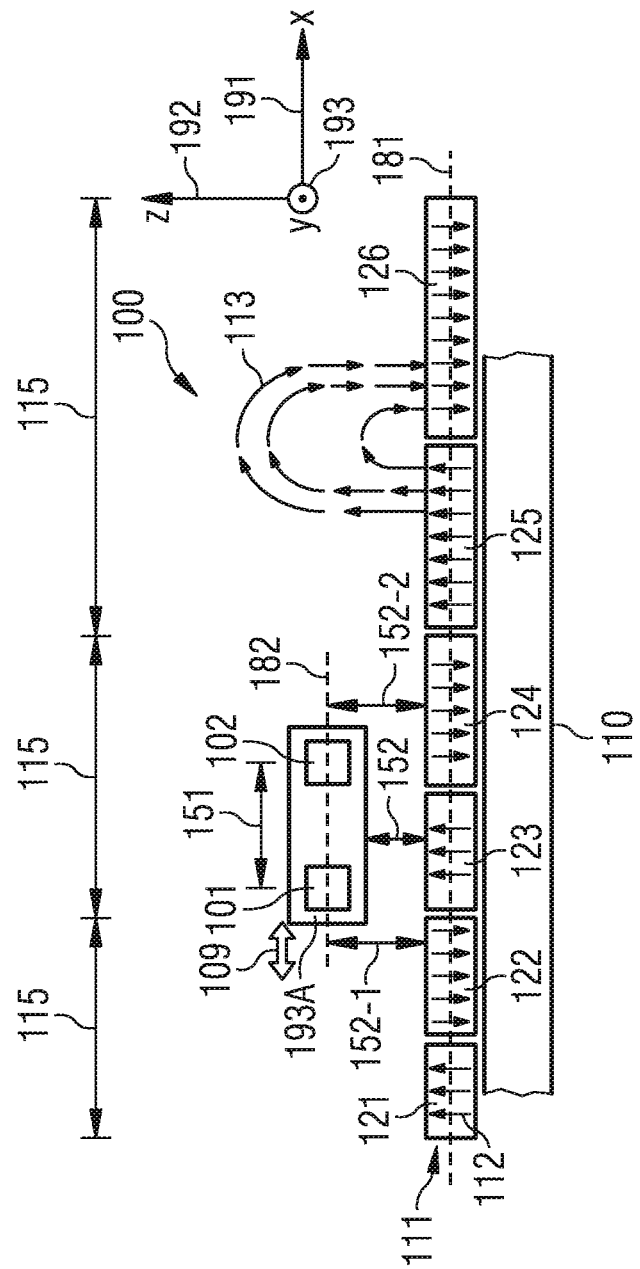

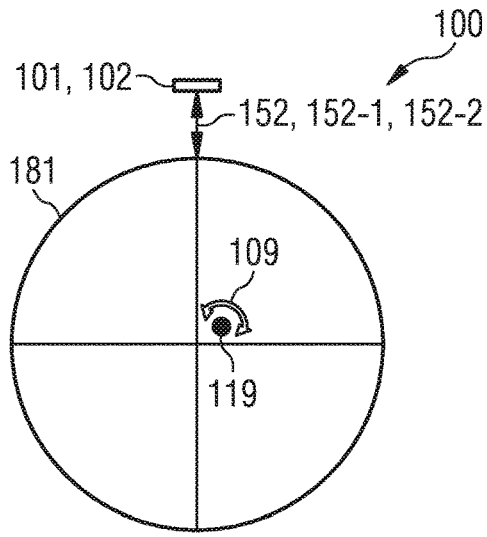
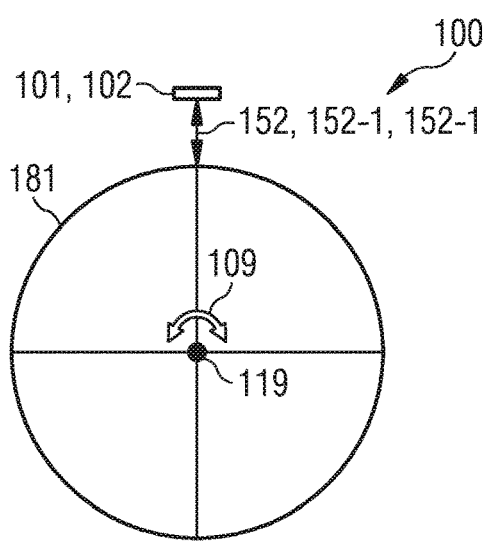
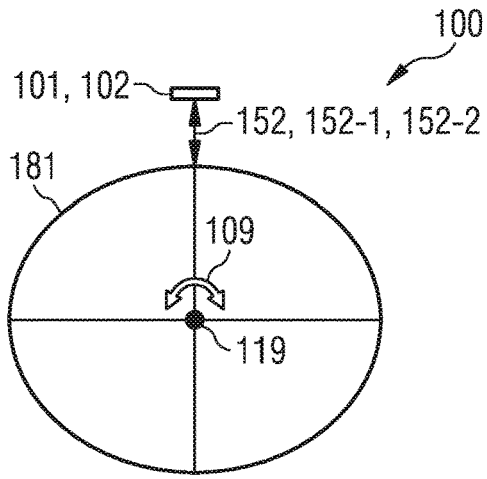

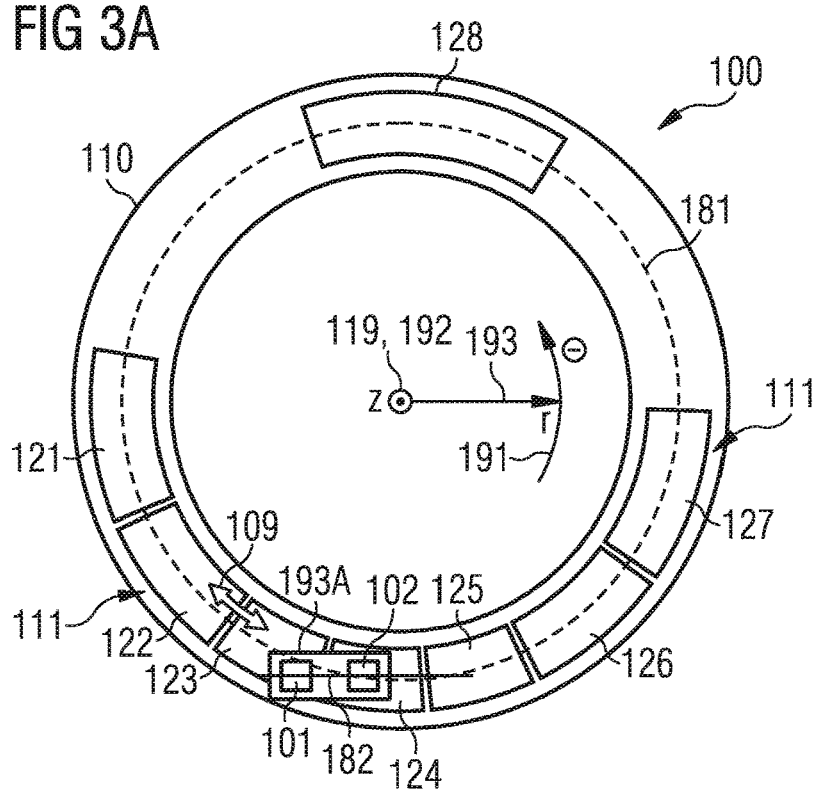
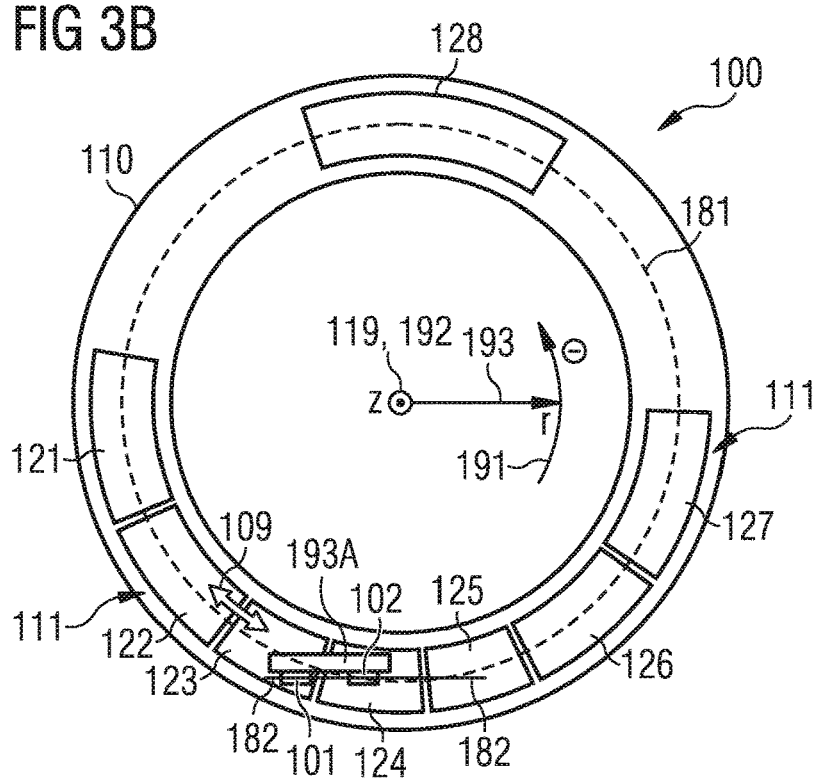

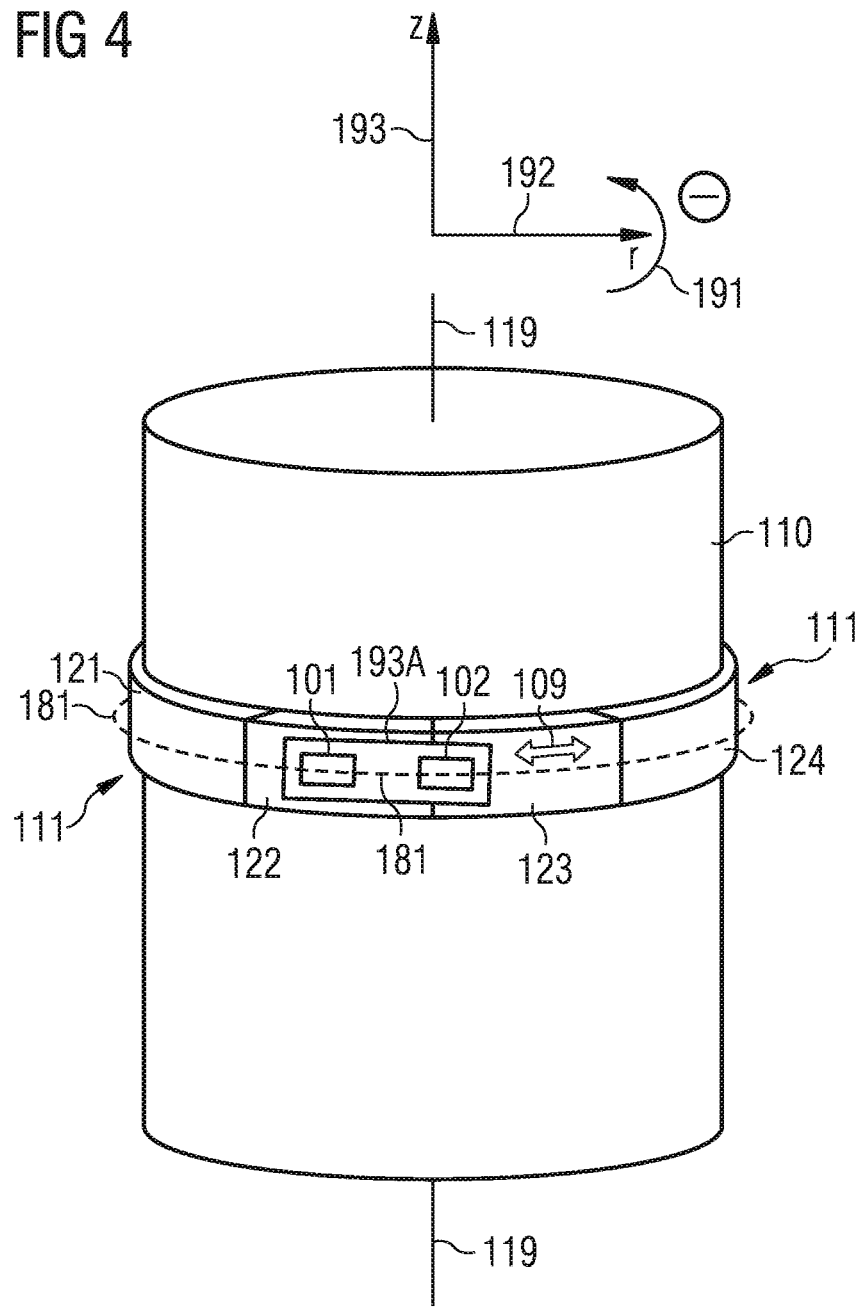

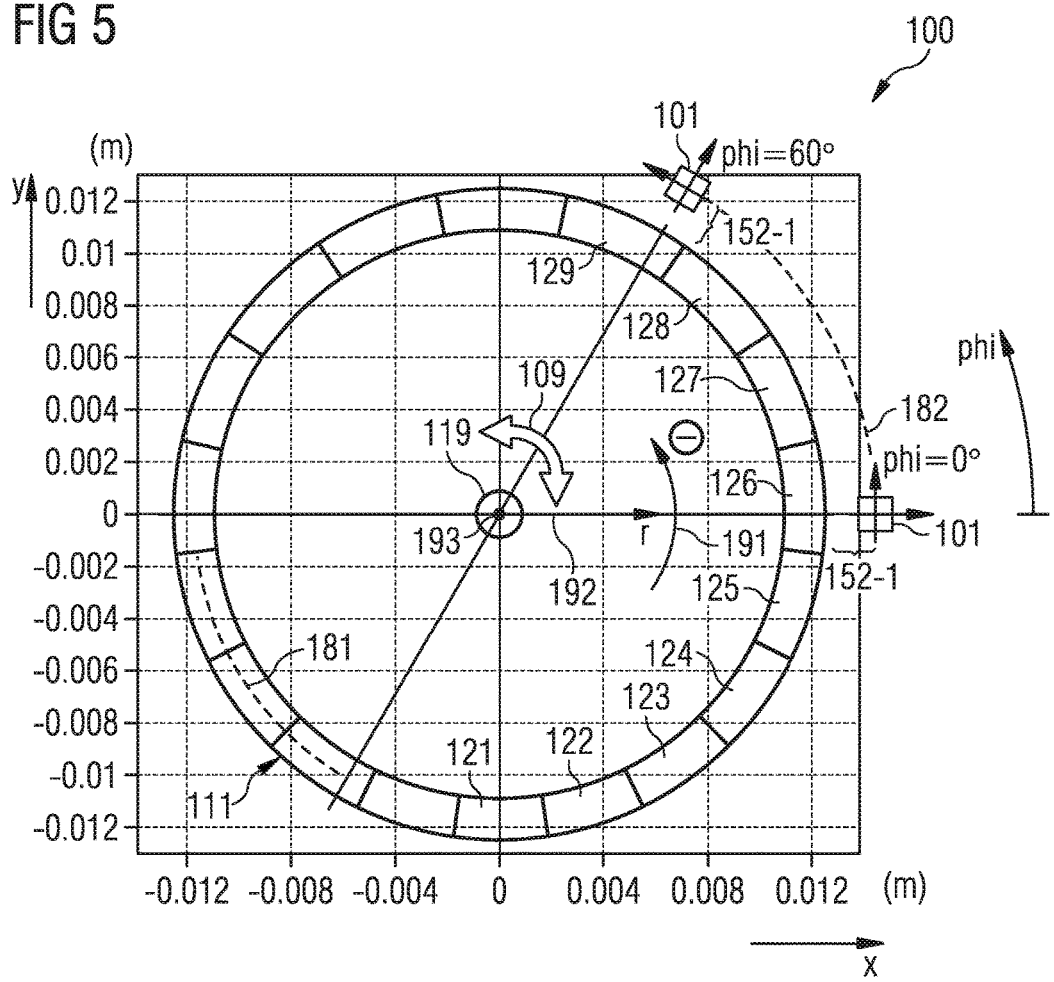

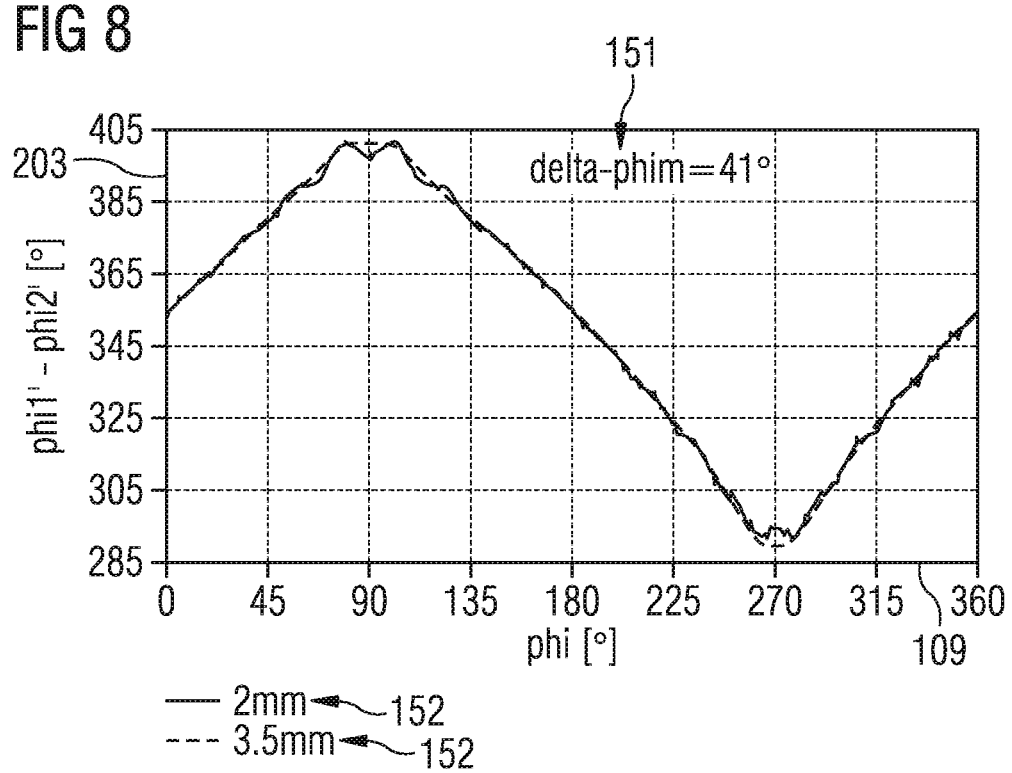
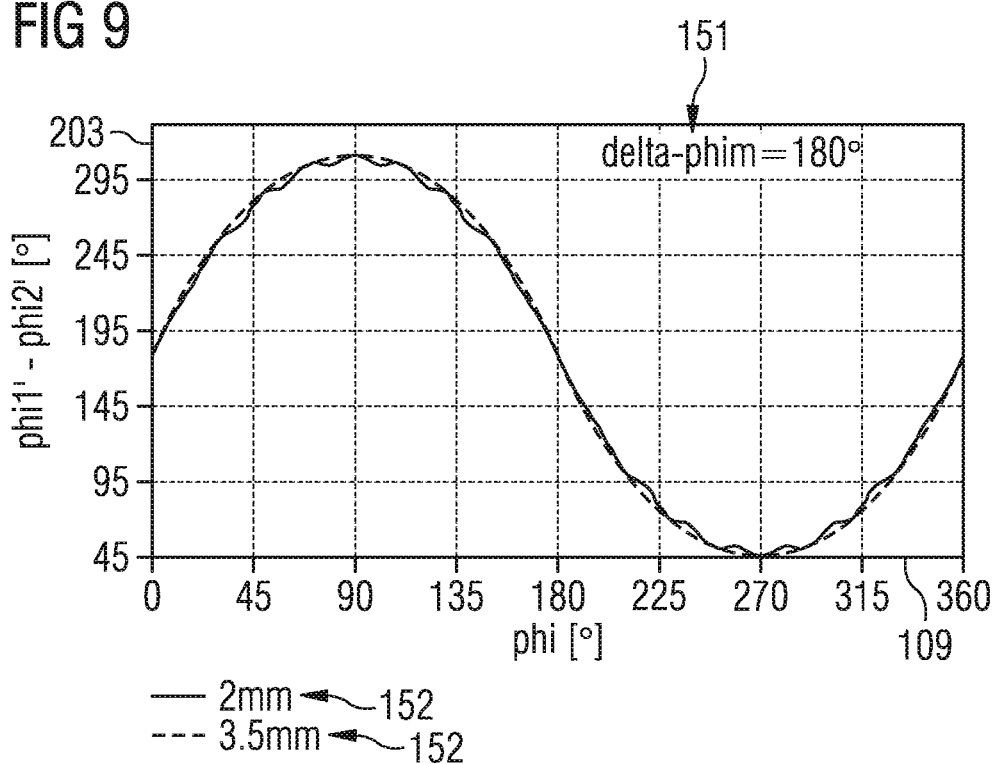

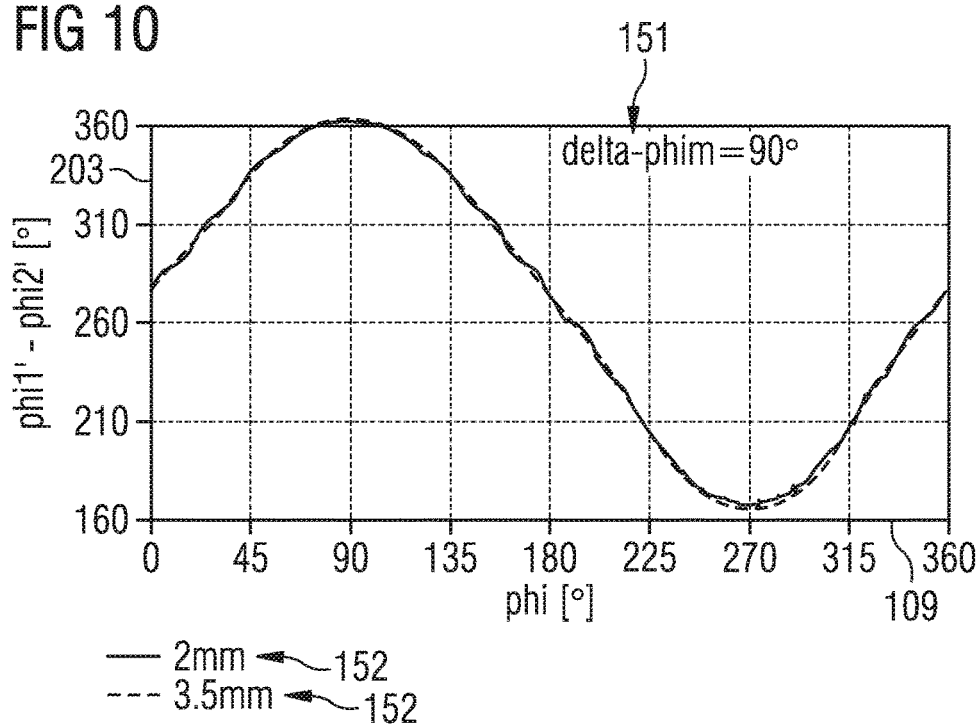
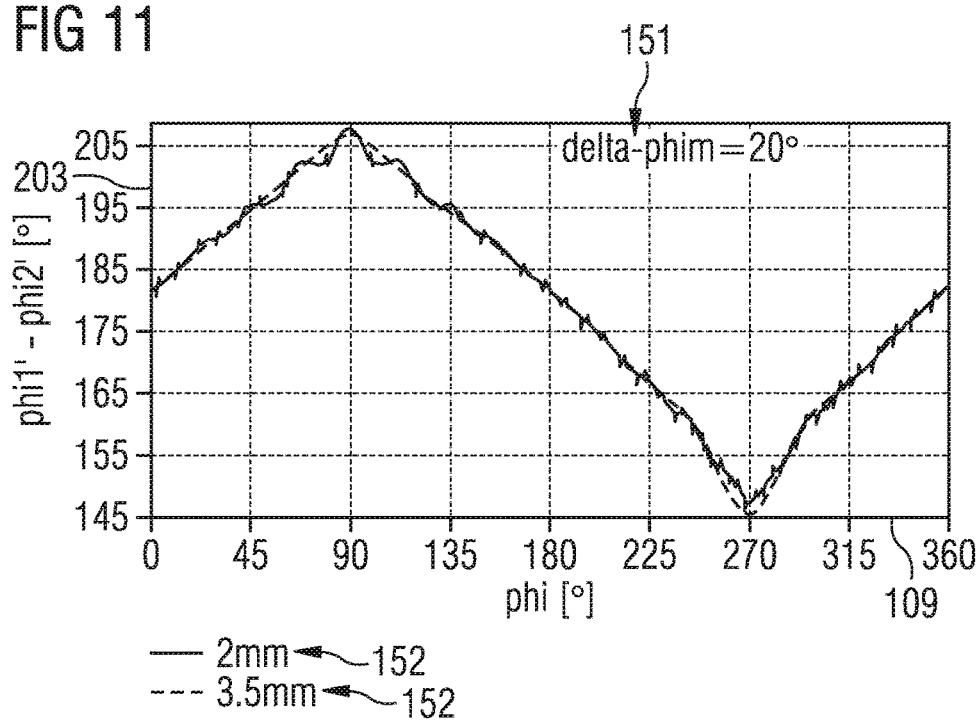

MAGNETIC POSITION SENSOR

CROSS REFERENCE TO RELATED APPLICATIONS

This application claims priority to German Application number 10 2016 102 978.5 filed on Feb. 19, 2016, the contents of which are incorporated by reference in their entirety.

FIELD

Various embodiments relate to a device comprising a permanent magnetic material, a first magnetic angle sensor, and a second magnetic angle sensor. The magnetization of the material has a periodicity which varies along a path. Various embodiments relate to a respective method.

BACKGROUND

In various applications, it can be desirable to determine, by means of a magnetic position sensor, a relative positioning between parts that are relatively movable with respect to each other. An example is a sensor in the field of gears or driveshafts. A respective sensor can, e.g., be configured to determine the relative positioning of a rotatable shaft. An example of such a technique is known from, e.g., U.S. Pat. No. 8,736,257 B2.

SUMMARY

Often, it can be desirable to determine the relative positioning of two parts which are movable relatively to each other by means of a magnetic position sensor at a high accuracy. In some applications, it can be desirable, alternatively or additionally, to implement corresponding devices with comparably small installation space and/or at comparably low costs.

According to an example, a device comprises a permanent magnetic material. The material extends along a path. The device also comprises a first magnetic angle sensor. The first magnetic angle sensor is configured to output at least one signal. The first magnetic angle sensor is positioned remotely from the material. The device also comprises a second magnetic angle sensor. The second magnetic angle sensor is configured to output at least one second signal. The second magnetic angle sensor is positioned remotely from the material. The second magnetic angle sensor is also positioned remotely from the first magnetic angle sensor. The device also comprises an evaluation unit. The evaluation unit is configured to determine, based on the at least one first signal and the at least one second signal, a relative positioning of the first magnetic angle sensor and the second magnetic angle sensor with respect to the material parallel to the path. The magnetization of the path has a periodicity which varies along the path.

According to an example, a method comprises receiving at least one first signal from a first magnetic angle sensor. The first magnetic angle sensor is positioned remotely from a permanent magnetic material. The method also comprises receiving at least one second signal from a second magnetic angle sensor. The second magnetic angle sensor is positioned remotely from the material. The second magnetic angle sensor is also positioned remotely from the first magnetic angle sensor. The material extends along a path. The method further comprises determining a relative positioning based on the at least one first signal and the at least one second signal. The relative positioning is defined between the first magnetic angle sensor and the second magnetic angle sensor with respect to the material and in parallel to the path. The magnetization of the material has a periodicity which varies along the path.

According to an example, a method comprises moving a permanent magnetic material along a path to a measurement position. The permanent magnetic material extends along the path. The method further comprises, in the measurement position, creating a stray magnetic field by the material. The stray magnetic field varies with a periodicity along a further path. The method further comprises measuring at least one observable which is indicative of the angle of the stray magnetic field at a first position along the further path. The method further comprises measuring at least one second observable indicative of an angle of the stray magnetic field at a second position along the further path. The method further comprises determining the measurement position based on the at least one first observable and the at least one second observable.

Features described above and features to be described hereinafter cannot only be used in the explicitly mentioned combinations, but also in further combinations or isolated without departing from the scope of the disclosure.

BRIEF DESCRIPTION OF THE DRAWINGS

The properties, features and effects of the disclosure, as well as the way how they are achieved will be explained in further detail with respect to the accompanying drawings.

FIG. 10 schematically illustrates the magnetization of the permanent magnetic material of the device of FIG. 1A, wherein the orientation of the magnetization of the material rotates along the path with a periodicity.

FIG. 2A illustrates schematically a device according to various embodiments, wherein the permanent magnetic material extends along a circular path, wherein a rotational axis of a carrier on which the material is positioned is eccentrically positioned with respect to the center of the circular path.

FIG. 2B illustrates schematically a device according to various embodiments, wherein the permanent magnetic material extends along a circular path, wherein the rotational axis of a carrier on which the material is positioned is concentrically positioned with respect to the center of the circular path.

FIG. 2C illustrates schematically a device according to various embodiments, wherein the permanent magnetic material extends along an elliptical path.

FIG. 3A illustrates schematically a device according to various embodiments, wherein the magnetic material extends along a circular path, wherein the material is positioned on a circular disk carrier, wherein the first magnetic angle sensor and the second magnetic angle sensor are respectively positioned remotely from a perimeter of the circular disk carrier in an axial direction.

FIG. 3B illustrates schematically a device according to various embodiments, wherein the permanent magnetic material extends along a circular path, wherein the material is positioned on a circular disk carrier, wherein the first magnetic angle sensor and the second magnetic angle sensor are respectively positioned remotely from a perimeter of the circular disk carrier in an axial direction.

FIG. 4 illustrates schematically a device according to various embodiments, wherein the permanent magnetic material extends along a circular path, wherein the material is positioned on a cylindrical carrier, wherein the first magnetic field sensor and the second magnetic field sensor are respectively positioned remotely from the surface of the cylindrical carrier in radial direction.

FIG. 5 illustrates schematically a device according to various embodiments, wherein the permanent magnetic material extends along a circular path.

FIG. 8 illustrates schematically a difference between the first signal and the second signal for a given distance between the first magnetic angle sensor and the second magnetic angle sensor as a function of the relative positioning for the scenario FIG. 5.

FIG. 9 illustrates schematically a difference between the first signal and the second signal for a given distance between the first magnetic angle sensor and the second magnetic angle sensor as a function of the relative positioning for the scenario of FIG. 5.

FIG. 10 illustrates schematically a difference between the first signal and the second signal for a given distance between the first magnetic angle sensor and the second magnetic angle sensor as a function of the relative positioning for the scenario of FIG. 5.

FIG. 11 illustrates schematically a difference between the first signal and the second signal for a given distance between the first magnetic angle sensor and the second magnetic angle sensor as a function of the relative positioning for the scenario of FIG. 5.

DETAILED DESCRIPTION OF EMBODIMENTS

Figure 1B:
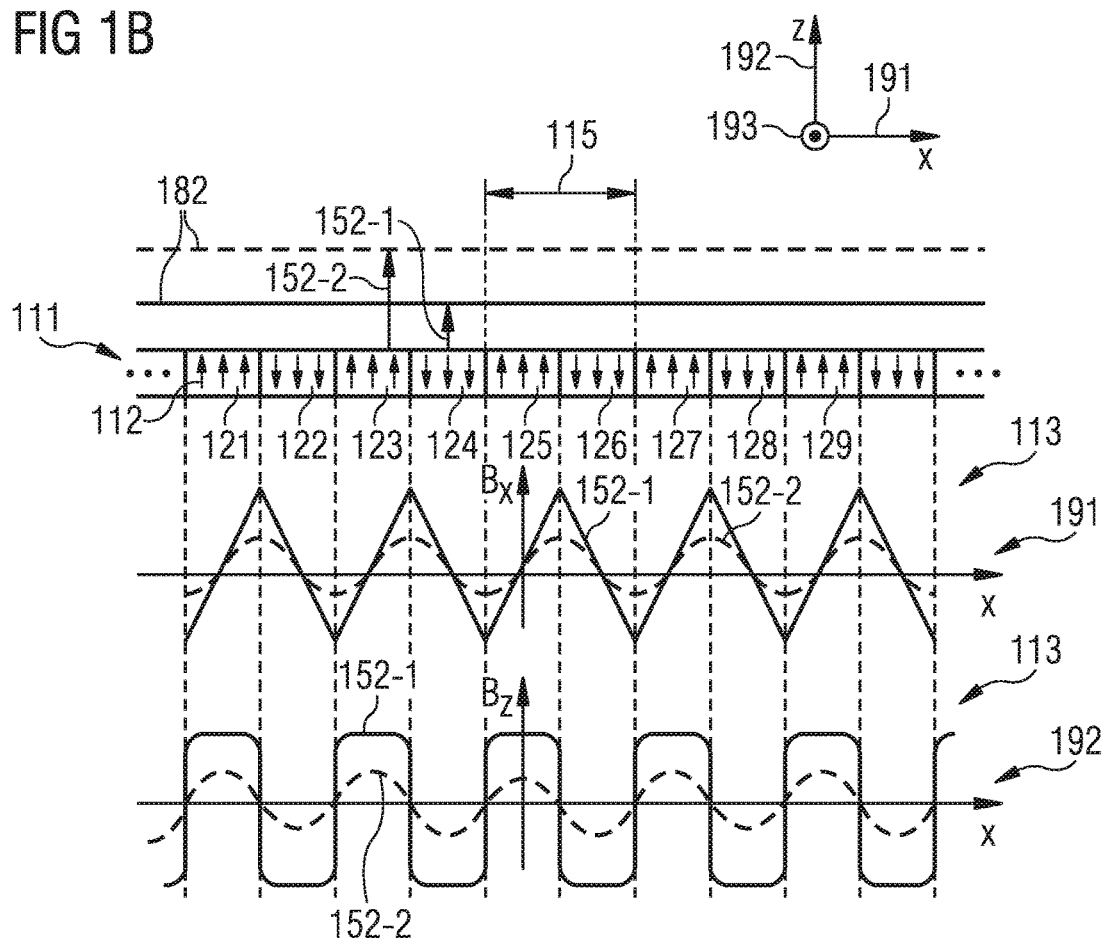
FIG. 1B schematically illustrates the stray magnetic field of the device of FIG. 1A for various positions along a further path which is orientated in parallel to the linear path.

Hereinafter, the disclosure is explained using preferred embodiments. The disclosure is explained with reference to the drawings. In the Figures, the same reference numerals denote the same or similar elements. The Figures are schematic representations of various embodiments. Elements depicted in the figures are not necessarily drawn to scale. Rather, the illustrated elements are depicted in the various Figures such that their function and general purpose becomes apparent to the person skilled in the art. Connections and couplings illustrated in the Figures between functional units and elements can also be implemented as indirect connections or couplings. A connection or coupling can be implemented wireless or wired. Functional entities can be implemented as hardware, software, or a combination of hardware and software.

Various examples relate to techniques of determining a relative positioning between, firstly, a first magnetic angle sensor and a second magnetic angle sensor and, secondly, a permanent magnetic material. Various examples relate to a corresponding device and a corresponding method which can be used for implementing a magnetic position sensor.

Techniques described herein for implementing a position sensor can allow to determine a relative positioning between two parts at a high accuracy. Alternatively or additionally, it is possible that the relative positioning is determined with a comparably low hardware-complexity and/or software-complexity. Further, it is possible that, alternatively or additionally, the relative positioning is determined using comparably small building space. It is also possible that capturing the relative positioning is robust against external interfering magnetic fields.

It is possible to use different magnetic angle sensors, e.g., Hall-effect based or GMR-based (giant magnetoresistance), AMR-based (anisotropic magnetoresistance) or TMR-based (tunnel magnetoresistance) magnetic angle sensors. The magnetic angle sensors can be respectively configured to output a signal which is indicative of the angle of the magnetic field with respect to the reference direction. The magnetic angle sensors can have a sensitivity which is defined in a plane. It is also possible to use magnetic angle sensors which have an out-of-playing sensitivity, e.g., Hall-plates in connection with vertical-Hall-effect-based sensors. Examples of magnetic angle sensors that can be used in connection with the present disclosure are, e.g.: TLE5010 (year 2015) or TLE5012 (year 2015) of Infineon Technologies AG.

The magnetic angle sensors can have different relative positioning with respect to each other. E.g., the magnetic angle sensors can have sensitive planes which exhibit a well-defined orientation with respect to each other. It would also be possible that the magnetic angle sensors are oriented parallel with respect to each other or enclose an angle with respect to each other.

The material extends along a path. Here, it is possible that in various examples the first magnetic angle sensor and the second magnetic angle sensor are positioned movable with respect to the material. Thereby, a relative positioning between the magnetic angle sensor and the material can be set. In particular, the relative positioning can have a component parallel to the path. Then, it is possible that the relative positioning parallel to the path is determined.

E.g., it would be possible that the first magnetic angle sensor and the second magnetic angle sensor are formed as static devices/stators and that the material is positioned movably. Alternatively, it would also be possible that the material is formed as a static device/stator and that the first magnetic angle sensor and the second magnetic angle sensor are positioned movably. In various examples it is also possible that, both, the first magnetic angle sensor and the second magnetic angle sensor, as well as the material are positioned movably.

Various examples relate to techniques of determining the relative positioning by measuring a stray magnetic field of the permanent magnetic material. Here, it is possible to measure an angle and, optionally, an amplitude of the stray magnetic field. Because of this, it is possible in various examples to determine the relative positioning contactless.

A respective device or a respective method can be employed in various applications. Example applications comprise: determining a rotation rate of a rotating shaft; determining a rotation angle of a rotating shaft; determining the velocity of a movable part; determining the position of a movable part. E.g., the techniques described herein can be employed in the field of motor control of a vehicle. It would also be possible that the techniques disclosed herein are employed in the field of gear control of a vehicle. It would also be possible that the techniques described herein are employed in the field of traction control or wheels of a vehicle.

Various embodiments rely on the specific configuration of the orientation and/or amplitude of the magnetization of the material along the path. By such a specific configuration of the magnetization, it is possible that the respective stray magnetic field encodes different relative positionings in the area of the magnetic angle sensors with a one-fold or at least a two-fold ambiguity. Thereby, it is possible to conclude on the relative positioning in an accurate and simple manner.

In various examples, the magnetization of the material has a spatial periodicity which varies along the path. I.e., the magnetization can have an orientation which varies as a function of the position along the path and/or can have an amplitude which varies as a function of the position along the path. Thereby, the orientation and/or amplitude can oscillate as a function of the position along the path with the periodicity. By providing the periodicity which varies along the path, a particularly accurate encoding of the relative positioning in the region around the magnetic angle sensors can be achieved by means of the stray magnetic field.

Different permanent magnetic materials may be employed. The material may form magnetic domains (multipole magnet). In an example, a multipole-stripe can be used. E.g., the material may comprise ferromagnetic compartments. The magnetization of the material can be imprinted by appropriate magnetizing techniques. For this, it is possible to bring a magnetic write head into the vicinity of the material. By such magnetizing techniques, different spatial dependencies of the magnetization can be implemented.

In various examples, techniques of determining the relative positioning between the material and the first magnetic angle sensor and the second magnetic angle sensor are described. By means of the techniques described herein, a linear position sensor or a rotational position sensor can be implemented.

FIG. 1A illustrates a device 100 which comprises a permanent magnetic material 111. E.g., the permanent magnetic material 111 can be a multi-pole magnet. The multi-pole magnet can, e.g., comprise a plurality of magnetic domains 121-126 having alternating polarity, e.g., can have North poles/South poles being oriented to the top/bottom. I.e., the magnetization 112 of the material 111 can vary along the path 181. In particular, the z-component 192 of the magnetization 112 varies. In the example of FIG. 1A, in particular, the orientation of the magnetization 112 rotates along the path 181 with the periodicity 115. The rotation can be step-wise or continuos. The magnetic domains 121-126 extend along an extent of the material 111, i.e., along a path 181 (in FIG. 1A along the x-axis 191). The thickness of the material 111 perpendicular to the path 181, i.e., along the y-axis 193 (perpendicular to the drawing plane of FIG. 1A), can be constant or may vary as a function of position along the path 181.

In the example of FIG. 1A, the material 111 is positioned on a carrier 110. The carrier 110 can be, e.g., a thin steel band or a metal foil. E.g., the carrier 110 may comprise ferromagnetic material. Thereby, the field strength of the stray magnetic field 113 of the material 111 (in FIG. 1A only schematically illustrated as an excerpt) can be amplified. In the example of FIG. 1A, the carrier 110 is positioned at a lower side of the material 111.

FIG. 1A illustrates a measurement position. In the measurement position, a part 193A is positioned at the upper side of the material 111 offset by a gap 152. The part 193A comprises a first magnetic angle sensor 101 and a second magnetic angle sensor 102. The gap 152-1 between the material 111 and the first magnetic angle sensor 101 and the gap 152-2 between the material 111 and the second magnetic angle sensor 102 are also illustrated in FIG. 1A. The gap 152-1, as well as the gap 152-2 are respectively defined perpendicularly to the path 181, i.e., along the z-axis 192.

From FIG. 1A it can be seen that the first magnetic angle sensor 101 is positioned remotely from the material 111 and further remotely from the second magnetic angle sensor 102; likewise, the second magnetic angle sensor 102 is positioned remotely from the material 111 and further remotely from the first magnetic angle sensor 101. The distance 151 between the first magnetic angle sensor 101 and the second magnetic angle sensor 102 along the further path 182 is illustrated in FIG. 1A.

The magnetic angle sensors 101, 102 are movable along a further path 182. They are moveable relatively with respect to the material 111; in various examples it is possible that the material 111 and/or the part 193A, respectively the angle sensors 101, 102, are formed as static devices. E.g., it would be possible that the material 111 is movable along the path 181, i.e., along the x-axis 191. Hereinafter, in the various examples the direction of movement is respectively denoted as axis 191. The magnetic angle sensors 101, 102 and the material 111 are positioned remotely from each other along the axis 192. Thereby, a relative positioning 109 between the part 193A and the material 111 can be adjusted. In the example of FIG. 1A, the path 181 and the path 182 are positioned parallel with respect to each other; generally, the paths 181, 182 can enclose an angle with respect to each other. If the paths 181, 182 are parallel with respect to each other, the gaps 152, 152-1, 152-2 remain substantially constant for different relative positionings 109.

Hereinafter, techniques are described which enable to determine the relative positioning 109 between the part 193A, i.e., the magnetic angle sensors 101, 102, and the material 111.

FIG. 1B illustrates aspects with respect to the stray magnetic field 113 of the magnetization 112 of the material 111. In FIG. 1B, components of the stray magnetic field 113 along the x-axis 191 (in FIG. 1B denoted as BX) and a component of the stray magnetic field 113 along the z-axis 192 (in FIG. 1B denoted as BZ) are respectively illustrated. These components of the stray magnetic field 113 are illustrated for different dimensions of the gaps 151-1, 152-2 (full line and dashed line in FIG. 1B).

From FIG. 1B it is apparent that the respective components 191, 192 of the stray magnetic field 113 oscillate with a periodicity which corresponds to the periodicity 115 with which the magnetization 111 oscillates between the various domains 121-129. For larger (smaller) dimensions of the gaps 151-1, 151-2, more abrupt (smoother) dependencies of the stray magnetic field 113 are achieved.

In the scenario of FIG. 1B, the amplitude of the stray magnetic field 113 is illustrated normalized. Typically, the amplitude of the stray magnetic field 113 decreases for larger distances to the material 111; i.e., the larger the dimension of the gaps 151, 152-1, 152-2, the smaller typically the amplitude. Additionally, typically, for larger (smaller) periodicities 115, a larger (smaller) amplitude of the stray magnetic field 113 is obtained.

In FIGS. 1A and 1B, the magnetization 111 is illustrated schematically. In particular, in these examples, sharply defined domain walls are illustrated between adjacent domains 121-129. This corresponds to a step-wise variation of the magnetization 112 of the material along the path 181. In various examples, it is also possible that the magnetization 112 of the material 111 varies continuously along the path 181.

Figure 1C:
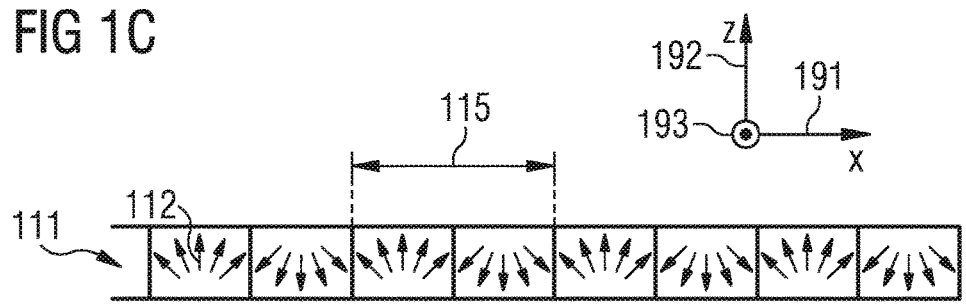
FIG. 1A schematically illustrates a device according to various embodiments, the device comprising a permanent magnetic material extending along a linear path, a first magnetic angle sensor, and a second magnetic angle sensor, the first and second magnetic angle sensors being positioned remotely from each other and further remotely from the material.

In FIG. 1C, aspects are illustrated with respect to the variation of the magnetization 112 of the material 111 along the path 181. In the example of FIG. 10, the orientation of the magnetization 112 rotates along the path 181 with the periodicity 115. The amplitude of the magnetization 112 is substantially constant, respectively equal to the saturation magnetization or the remanence magnetization. E.g., the magnetization can be described by a Halbach-shape. See, e.g., K. Halbach "Design of permanent multipole magnets with oriented rare earth cobalt material" in Nuclear Instruments and Methods, 169 (1980) 1-10.

The various aspects as described with respect to FIGS. 1B and 1C can be used in the various disclosed examples to determine the relative positioning 109. For this, e.g., the variation of the magnetization 111 along the path 180 can be tailored by appropriate magnetizing techniques such that the stray magnetic field 113 encodes the relative positioning 109 with a one-fold or two-fold ambiguity. E.g., it would be possible that the variation of the magnetization 111 is tailored along the path 181 such that a difference of the stray magnetic field 113 between two different points along the further path 182 encodes the relative positioning 109 with a one-fold or two-fold ambiguity.

Now referring again to FIG. 1A, it is apparent that the periodicity 115 in this example increases monotonically along the x-axis 191, i.e., along the path 181. E.g., it would be possible that the periodicity 115 monotonically increases between opposite ends of the material 111. In further examples, it would be possible, e.g., that the periodicity 115, at least over a certain distance, increases monotonically: e.g., it would be possible that the periodicity 115 increases monotonically along the path 181 for at least three periods, i.e., domains 121-129, preferably for at least five periods, more preferably for at least eight periods.

E.g., the periodicity may be defined between two or more adjacent, repetitive orientations and/or amplitudes of the magnetization. Regarding the definition of the periodicity: it is noted that in the strict mathematical sense, a period is only present for exact repetitions of the functional dependency at an infinite number of different offset positions such that: $f(x+p)=f(x)$, wherein p denotes the periodicity along the path. The path may extend an x-direction. f denotes one or more components of the magnetization vector or the material. If the periodicity varies along the path—i.e., $p=p(x)$—this yields for the periodicity: $f(x+p(x))=f(x)$. In FIG. 1A, the thickness of the magnetic poles is constant in z-direction and the width of the magnetic poles is arbitrary in y-direction, i.e., constant or increasing or, in general, varying. I.e., the geometry of the magnetic material in the directions perpendicular to the path may not be considered as a criterion for the periodicity.

Hereinafter, the functionality of the device 100 for determining the relative positioning 109 is described. Here, the projection of the stray magnetic field 113 into the XZ-plane is measured by the magnetic angle sensors 101, 102; this projection is rotating in the XZ-plane as a function of the position of the material 111 along the path 181, respectively of the relative positioning 109. I.e., a plot of the vector {BX, BZ} having an end which is fixed to the origin of the (BX, BZ)—plane corresponds to movement of the tip of this vector on a circle which is fixed to the origin. If the position of the magnetic angle sensors 101, 102, i.e., of the sampling point, is moved—at constant dimensions of the gaps 152, 152-1, 152-2—along the further path 182, i.e., along the x-axis 191, towards the larger domains 121-126 (in FIG. 1A in positive direction of the x-axis 191), the length of the vector increases during rotation such that the tip of the vector {BX, BZ} moves on a spiral. This effect occurs due to the larger amplitudes of the stray magnetic field 113 at larger periodicities 115. For a movement above a single North pole and to the neighboring adjacent South pole, the vector rotates with respect to the origin in the (BX, BZ)-plane by one full revolution. For seven subsequent North poles/South poles, the vector rotates seven times with respect to the origin, wherein the length of the vector increases continuously; thereby, the tip of the vector moves along a spiral-shaped path.

The angle between the {BX, BZ}-vector and a reference direction in the (BX, BZ)-plane, e.g., the direction which is defined by {1, 0}, can be determined by means of the magnetic angle sensors 101, 102. Depending on the type of the magnetic angle sensor 101, 102, the main surface, respectively the sensitive plane, of the magnetic angle sensors 101, 102 is parallel to the XZ-plane.

If the periodicity 115 was not vary as a function of the position along the path 181 (not depicted in FIG. 1A): in such a case, the magnetic angle sensors 101, 102 would detect linearly varying angles if the part 193A is moved into different relative positionings 109 along the path 182 and/or if the material 111 is moved into different relative positionings 109 along the path 182. Here, the angles detected by the magnetic angle sensors 101, 102 would show a constant difference. The difference would be given by $$\delta = 360° \, s./(2L) \quad (1)$$

wherein s denotes the distance 151 and L denotes the length of the various North poles and South poles 121-129.

In the scenario illustrated in FIG. 1A, however, the periodicity 115 varies monotonically as a function of the position along the path 181. In such a case, the difference between the angles measured by the magnetic angle sensors 101, 102 varies accordingly as a function of the relative positioning 109

$$\delta = 360° \, s./(L_n + L_m), \quad (2)$$

wherein $L_n$ and $L_m$ denote the length of neighboring poles along the path which are closest to the center of the two magnetic angle sensors 101, 102. I.e., the difference of the angles measured by the two magnetic angle sensors 101, 102 has a dependency of one-fold ambiguity (i.e., being unambigious and uniquely defined) on the relative positioning 109. Thereby, the system 100 according to FIG. 1 can be operated as a linear positioning sensor.

In the example of FIG. 1A, the path 181 is linear and the material 111 is positioned on a linear, elongated carrier 110 which extends in parallel to the path 181. Other geometries of the path 181 are possible.

In FIG. 2A aspects with respect to a circular path 181 are illustrated. E.g., the material 181 could be positioned on a cylindrical carrier in the example of FIG. 2A (in FIG. 2A, the carrier is not illustrated). In the example of FIG. 2A, the device 100 implements a rotational sensor. In the example of FIG. 2A, for this the material 111 (not illustrated in FIG. 2A) including the carrier is rotated with respect to the rotational axis 119 (orientated perpendicularly to the drawing plane in FIG. 2A). In the example of FIG. 2A, the rotational axis 119 is positioned remotely from, respectively eccentrically with respect to the center point of the circular path 181. Thereby, the dimensions of the gaps 152, 152-1, 152-2 between the material 111, respectively the path 181, and the magnetic angle sensors 101, 102 vary as a function of the relative positioning 109. E.g., it is possible that the eccentricity of the rotational axis 119 is selected such that the variation of the dimensions of the gaps 152, 152-1, 152-2 compensates for changes in the amplitude of the stray magnetic field 113 at the position of the magnetic angle sensors 101, 102 due to the varying periodicity 115. In other words, it is possible that the dimensions of the gaps 152, 152-1, 152-2 vary as a function of the relative positioning 109 according to the variation of the periodicity 115. Thereby, a variation in the amplitude of the stray magnetic field 113 as a function of the relative positioning 109 can be reduced; thereby, a particularly precise determining of the relative positioning 109 may be facilitated.

In other examples, it is possible that the dimensions of the gaps 152, 152-1, 152-2 remain constant as a function of the relative positioning 109. Such an example is illustrated with respect to FIG. 2B (respectively with respect to FIG. 1A). In the example of FIG. 2B, the rotational axis 119 is concentrically positioned with respect to the center point of the circular path 181.

With respect to FIG. 2C, aspects with respect to a path 181 which is elliptical are illustrated. In the example of FIG. 2C, the rotational axis 119 is positioned at the center of the elliptical path 181. In the example of FIG. 2C, the dimensions of the gaps 152, 152-1, 152-2 vary as a function of the relative positioning 109. It is also possible that the path is eikonal, wherein in such a scenario the areas of maximum curvature show different curvature. Elliptical and a eikonal paths may be combined with respect to arbitrary positions of the rotational axis to thereby taylor an appropriate variation of the distance/dimension of the gaps versus rotational angle, such that the amplitude of the stray magnetic field 113 is substantially constant for all relative positionings 109.

FIG. 3A illustrates aspects with respect to a circular disk carrier 110. In the example of FIG. 3A, the path 181 is circular. The material 111 is positioned on a circular disk carrier 110. The first magnetic angle sensor 101 and the second magnetic angle sensor 102 are, respectively, positioned remotely from the circumference of the circular disk carrier 110 in axial direction 192. In the example of FIG. 3A, the path 182 is not exactly parallel to the path 181. In particular, in the example of FIG. 3A, the further path 182 is linear while the path 181 is circular. Nonetheless, the magnetic angle sensors 101, 102 are arranged with a distance 151 with respect to each other which has a component parallel to the direction of movement, in the example of FIG. 3A the azimuthal direction 191. In the example of FIG. 3A, the magnetic angle sensors 101, 102 may measure a rotational position of the projection of the stray magnetic field 113 into a plane which is parallel to the rotational axis and which is further parallel to the path 182. Both magnetic angle sensors 101, 102 measure and out-of-plane angle with respect to the substrate of the part 193A. E.g., such a scenario could be implemented by a combination of Hall plates and Vertical-Hall-effect-based sensors.

FIG. 3B generally relates to FIG. 3A, wherein in the example of FIG. 3B the magnetic angle sensors 101, 102 are rotated around a rotation direction which is parallel to the further path 182 if compared to the scenario of FIG. 3A and measure a projection of the stray magnetic field 113 into a plane which is parallel to said rotational axis and parallel to the path 182. Such a geometry may be implemented by conventional magnetic angle sensors which have an in-plane sensitivity. With reference to the part 193A, both magnetic angle sensors 101, 102 measure an in-plane angle.

FIG. 4 illustrates aspects with respect to a cylindrical carrier 110. In the example of FIG. 4, the material 111 is positioned close to the surface of the carrier 110. The magnetic angle sensors 101, 102 are respectively positioned remotely from the material 111 in radial direction 192. In the example of FIG. 4, the magnetic angle sensors 101, 102 have a larger radial distance from the rotational axis 119 if compared to the material 111 (different to the scenario of FIGS. 3A and 3B). In the example of FIG. 4, the dimensions of the gaps 152, 152-1, 152-2 are constant as a function of the relative positioning 109. By appropriately shaping the carrier 110, it would also be possible to implement a non-constant distance.

In the example of FIG. 4, the gaps 152, 152-1, 152-2 extend in radial direction; differently, in the example of FIGS. 3A, 3B, the gaps 152, 152-1, 152-2 extend in axial direction.

Depending on the application, it is possible that one of the scenarios of FIGS. 1, 3A, 3B or 4 is preferred. E.g., by appropriately selecting the geometrical shape of the material, it is possible to reduce the required building space. If the material is positioned on a rotatably mounted shaft, the assembly according to FIGS. 3A, 3B is more robust against radial airstream, while the assembly according to FIG. 4 is more robust against axial tolerances. "Robust" can refer to a situation in which, due to tolerances, the measurement of the angular position shows comparably small inaccuracies.

FIG. 5 illustrates aspects with respect to the magnetization 112 of the material 111 which extends along a circular path 181. In the example of FIG. 5, a cross-section through the material 111 in the plane of the axes 191, 192 is illustrated. FIG. 2, thus, illustrates a view in axial direction onto the assembly of FIG. 4. In FIG. 5, the rotational axis 119 is also illustrated; the rotational axis 119 is oriented perpendicular to the drawing plane. For sake of simplicity, in FIG. 5 only the first magnetic angle sensor 101 is illustrated; the second magnetic angle sensor 102 is not illustrated.

In the example of FIG. 5, the material 111 shows the following dimensions: inner diameter 25 mm; outer diameter 22 mm; remanence magnetic field strength 500 mT; direction of the magnetization of poles 121-129 oriented radially inwards or radially outwards, respectively; size of the pole 121 17°; size of the pole 122 17.6085°; size of the pole 123 18.2387°; size of the pole 124 18.8915°; size of the pole 125 19.5676°; size of the pole 126 20.268°; size of the pole 127 21.7448°; size of the pole 128 22.523°; size of the pole 129 23.3282°; the size of the subsequent poles decreases correspondingly.

A rotational angle Phi is defined. The angle Phi corresponds to a given relative positioning 109. In the measurement position as illustrated in FIG. 5, the first magnetic angle sensor is arranged at the position X=14.5 mm and Y=0 mm, i.e., at the rotational position Phi=0°. The sensitive point of the first magnetic angle sensor 101 is, therefore, positioned remotely from the material 111 by 2 mm, which corresponds to the gap 152-1. In a second measurement position of FIG. 5, the first magnetic angle sensor 101 is arranged at the angle Phi=60°; the distance also amounts to 2 mm which corresponds to the gap 152-1. Because of this, the paths 181, 182 are parallel to each other.

The magnetic angle sensor 101 detects a signal which is indicative for the angle Phi1' between the radial and azimuthal component of the stray magnetic field 113 (BR, BPsi) such that:

$$\text{Phi1'}=\arctan 2(\text{BR},\text{BPsi}). \tag{3}$$

The relative positioning 109, Phi—e.g., defined with respect to the first sensor 101—is determined based on the angle Phi1'. In a simple scenario: Phi=Phi1'. It is also possible that Phi is a function of Phi', i.e., Phi=f (Phi1').

E.g., Phi may be a function of the measurement values of both magnetic angle sensors 101, 102, i.e., $$\text{Phi}=f(\text{Phi1'}, \text{Phi2'}). \tag{4}$$

In particular, the relative positioning 109, Phi may be determined as a function of the difference between the measurement values:

$$\text{Phi}=f(\text{Phi1'}-\text{Phi2'}). \tag{5}$$

E.g., a numerical or analytical calculation can be performed or a lookup table may be used. In the lookup table, it is possible that for different values of Phi', respectively, a single value of Phi is stored. It is also possible that a combination of a lookup table and a calculation is used; such a case can be in particularly feasible where systematic differences are present.

A magnetic angle sensor can output the angle of the stray magnetic field 0-360° as a signal. E.g., an evaluation unit can subtract two angles and correct a 360°—overflow. A magnetic angle sensor can perform calculations. E.g., based on a plurality of measurement values, e.g., sine+cosine, the angle can be calculated; e.g., based on arc tan. In further examples it is possible that the magnetic angle sensor outputs sine- and cosine-signal pairs and an evaluation unit uses these signals for further calculation. If the signal pairs (C1, S1) and (C2, S2) correspond to sine/cosine of two magnetic angle sensors, the angle difference can be calculated as follows, without difficulties relating to overflow: arc sin (C1*S2-C2*S1). A small angle approximation may be used.

Figure 6:
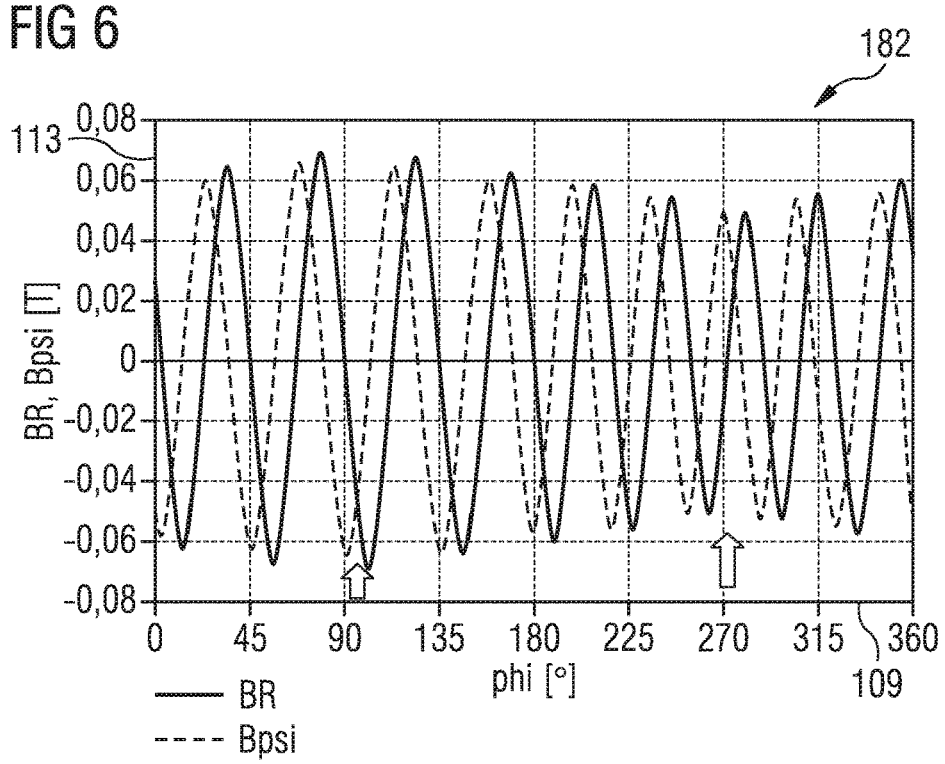
FIG. 6 illustrates schematically the variation of the stray magnetic field of the magnetization of the material along a further path as a function of the relative positioning for the scenario of FIG. 5.

FIG. 6 illustrates the component of the stray magnetic field 113 along the path 182 for various relative positionings 109.

From FIG. 6 it is apparent that the components of the stray magnetic field 113 are both sine-shaped and have comparable amplitudes. From FIG. 6 it is further apparent that the two components of the stray magnetic field 113 show a phase shift of 90°. From FIG. 6 it is also apparent that the amplitude of the stray magnetic field 113 varies as a function of position along the further path 182. The amplitude approaches a minimum in the range of Phi=270° (marked by a vertical arrow), because the smallest pole 121, respectively the shortest periodicity 115, is positioned there. In the range of Phi=90° the components of the stray magnetic field 113 have the largest amplitudes (marked by a vertical arrow), because the largest pole 129, respectively the largest periodicity 115, is positioned there.

Figure 7:
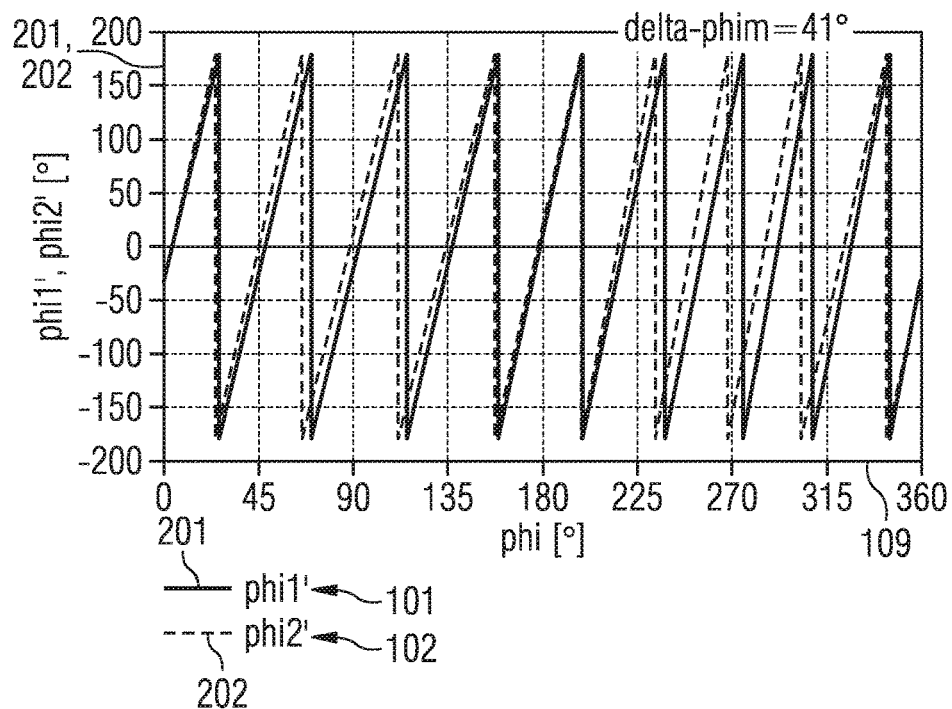
FIG. 7 illustrates schematically a first signal of the first magnetic angle sensor which is indicative of the angle of the stray magnetic field of the magnetization of the material at the position of the first magnetic angle sensor and a second signal of the second magnetic angle sensor which is indicative of the angle of the stray magnetic field of the magnetization of the material at the position of the second magnetic angle sensor as a function of the relative positioning for the scenario of FIG. 5.

In the example of FIG. 7, the first signal 201 of the first magnetic angle sensor 101 (continuous line) and the second signal 202 of the second magnetic angle sensor 102 (dashed line) are illustrated for different relative positionings 109. The magnetic angle sensors 101, 102 measure an orientation of the stray magnetic field 113; because of this, the variation of the amplitude of the stray magnetic field 113, in first approximation, is not relevant.

The example of FIG. 7 is based on the material 111 of FIG. 5; in the example of FIG. 7, the first magnetic angle sensor 101 is positioned at Phi=−20.5° and the second magnetic angle sensor 102 is positioned at Phi=+20.5°. Because of this, the magnetic angle sensors 101, 102 in the example of FIG. 7 have a distance 151 of delta-Phim of 41° with respect to each other. The first magnetic angle sensor 101 detects Phi1'=arctan2(BR, Bpsi) and a second magnetic angle sensor 102 detects Phi2'=arctan2(BR, Bpsi), respectively, at the corresponding positions. Different relative positionings 109 in FIG. 7 relate to a rotation of the material 111 around the rotational axis 119 and/or to a rotation of the magnetic angle sensors 101, 102 around the rotational axis 119.

From FIG. 7 it is apparent that two magnetic angle sensors 101, 102 detect equal values close to the relative positioning 109 for Phi=0° and Phi=180°, while the second magnetic angle sensor 102 precedes the first magnetic angle sensor 101 close to the relative positioning 109 at Phi=90° and lags behind the first magnetic angle sensor 101 close to the relative positioning 109 at Phi=270°.

FIG. 8 illustrates the difference 203 of the first signal 201 and of the second signal 202 of FIG. 7 (full line), i.e., Phi1'-Phi2'. From FIG. 8 it is apparent that the difference 203 almost shows a triangular shape, wherein higher frequency oscillation are superimposed. These oscillations are due to deviations of the dependency of the components of the stray magnetic field 113 from a perfect sinusoidal shape due to the finite dimension of the gaps 152, 152-1, 152-2 (cf. FIG. 1B). Typically, magnetic multipole stripes having homogeneous magnetization in all domains and alternating signs of the magnetization in neighboring domains, i.e., magnetic multipole stripes having a rectangularly formed spatial dependency of the magnetization, create perfectly harmonic stray magnetic fields only at large distances to the material. At smaller distances, no clean sinusoidal dependency of the stray magnetic field component as a function of the position is achieved, as illustrated in FIG. 1B. In the example of FIGS. 5 and 8, the dimensions of the gaps 152, 152-1, 152-2 in the area of the largest domain 129 are smaller than half of the dimension of said domain 129. From this, deviations from the clean sinusoidal dependencies result and the wavy curve according to FIG. 8 is obtained.

In FIG. 8, also the difference signal 203 is illustrated for larger dimensions of the gaps 152, 152-1, 152-2 of 3.5 mm (dashed line). The distance 151 between the magnetic angle sensors 101, 102 still remains at 41°. Due to the larger dimension of the gaps 152, 152-1, 152-2, smaller amplitudes between 15.6 mT and 28.2 mT are measured, depending on the relative positioning 109. Due to the larger gaps 152, 152-1, 152-2, the difference signal 203 shows a smoother variation. Thereby, an error in determining the relative positioning 109 may be reduced.

A further approach to reduce the waviness of the difference signal 203 is to use a smooth dependency of the magnetization 112 on the position along the path 181 (magnetization pattern). E.g., instead of employing a rectangular magnetization as a function of the position along the path 181, a Halbach-magnetization can be used. The Halbach-magnetization is given by the following equation:

$$\vec{M} = M_s \cos(p_3 \psi) \vec{n}_R + M_s \sin(p_3 \psi) \vec{n}_\psi = M_s \cos((p_3+1))$$
$$\vec{n}_x = M_s \sin((p_3+1)\psi) \vec{n}_y \quad (6)$$

wherein M denotes the magnetization 112, $M_s$ the saturation magnetization, $p_3$ the number of pole pairs, and $(R,\psi)$ denotes the radial and azimuthal position. $\vec{n}_R$, $\vec{n}_\psi$ are unity vectors in radial direction and azimuthal direction. $\vec{n}_x$, $\vec{n}_y$ are normal vectors in x,y direction of a Cartesian coordinate system which has its center statically at the rotational axis 119, the rotational axis 199 being also the symmetry axis. If $p_3$ has a constant value, all poles 121-129 are of the same size. If $p_3$ shows a dependency of $\psi$, the dimensions of the poles 121-129 vary along the azimuthal direction. E.g., $p_3$ could monotonically increase in the range of $-90°<\psi<90°$ and monotonically decrease in the range of $90°<\psi<270°$ to obtain the poles having sizes according to FIG. 5.

FIG. 9 illustrates the difference signal 203 for a distance 151 between the magnetic angle sensors 101, 102 amounting to 180° and for dimensions of the gaps 152, 152-1, 152-2 of 2 mm (full line) and 3.5 mm (dashed line).

FIG. 10 illustrates the difference signal 203 for a distance 151 between the magnetic angle sensors 101, 102 amounting 90° and for dimensions of the gaps 152, 152-1, 152-2 of 2 mm (full line) and 3.5 mm (dashed line).

FIG. 11 illustrates the difference signal 203 for a distance 151 between the magnetic angle sensors 101, 102 amounting 20° and for dimensions of the gaps 152, 152-1, 152-2 of 2 mm (full line) and 3.5 mm (dashed line).

Figure 12:
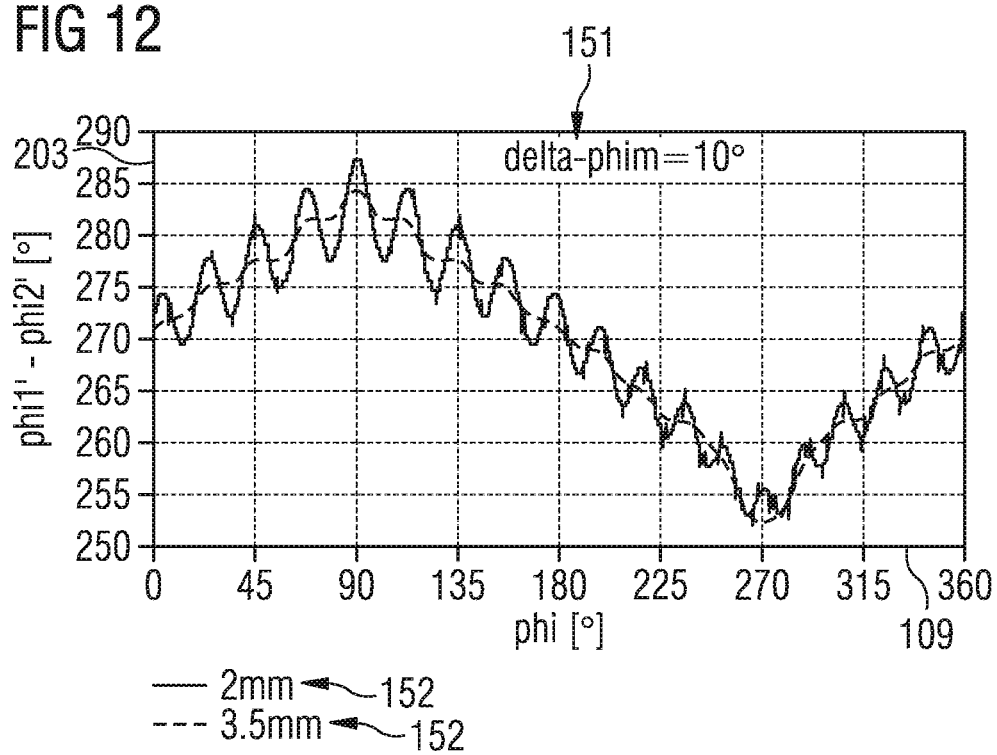
FIG. 12 illustrates schematically a difference between the first signal and the second signal for a given distance between the first magnetic angle sensor and the second magnetic angle sensor as a function of the relative positioning for the scenario FIG. 5.

FIG. 12 illustrates the difference signal 203 for a distance 151 between the magnetic angle sensors 101, 102 amounting 10° and for dimensions of the gaps 152, 152-1, 152-2 of 2 mm (full line) and 3.5 mm (dashed line).

Figure 13:
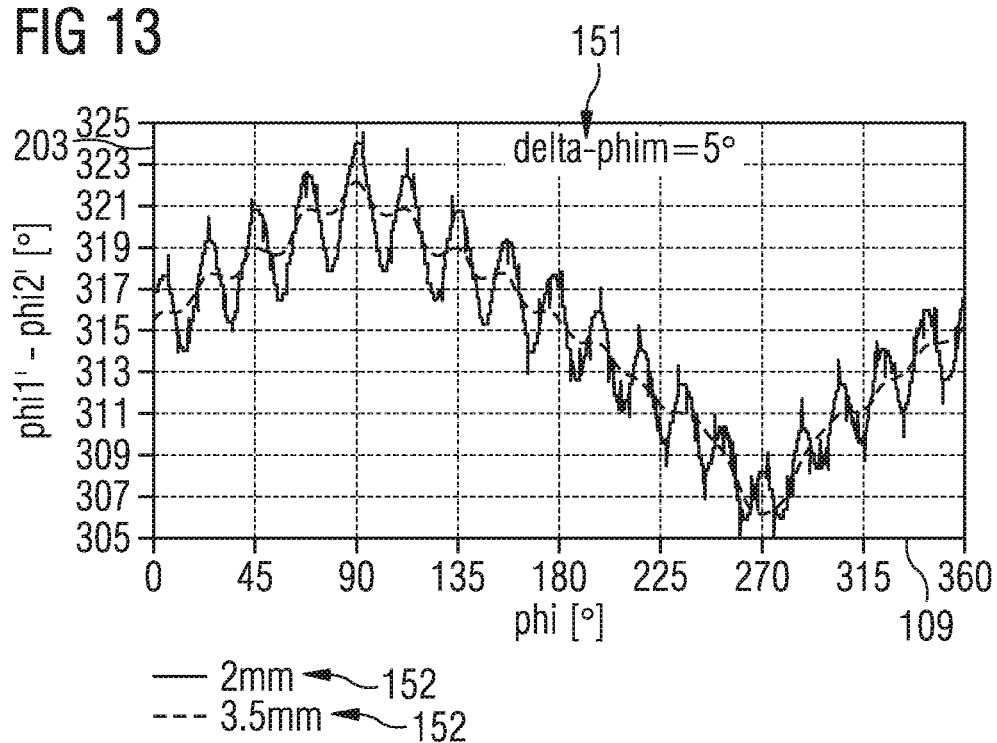
FIG. 13 illustrates schematically a difference between the first signal and the second signal for a given distance between the first magnetic angle sensor and the second magnetic angle sensor as a function of the relative positioning for the scenario of FIG. 5.

FIG. 13 illustrates the difference signal 203 for a distance 151 between the magnetic angle sensors 101, 102 amounting 5° and for a dimension of the gaps 152, 152-1, 152-2 of 2 mm (full line) and 3.5 mm (dashed line).

From a comparison of FIGS. 9-13, it is apparent that the waviness varies. For comparably small distances 151, e.g., smaller than 15° (cf. FIGS. 12, 13), large superimposed oscillations are also observed at comparably large dimensions of the gaps 152, 152-1, 152-2. Because of this, it may be preferable that the distance 151 between the magnetic angle sensors 101, 102 parallel to the further path 182 is larger than a minimum of the periodicity 115. Here, a projection of the distance 151 between the magnetic angle sensors 101, 102 onto the path 181 can be considered. Preferably, the distance 115 is at least twice or at least four times as large. Thereby, the waviness can be reduced; thereby, an error in the determining of the relative positioning 109 can be reduced.

Figure 14:
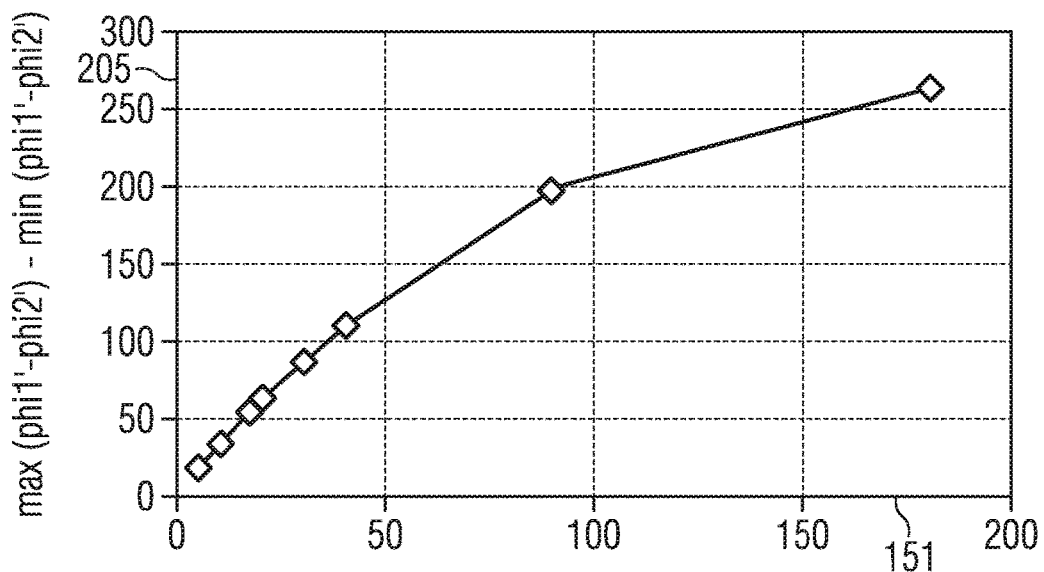
FIG. 14 illustrates schematically the strength of variation of the difference between the first signal and the second signal as a function of the distance between the first magnetic angle sensor and the second magnetic angle sensor for the scenario FIG. 5.

FIG. 14 illustrates the strength of variation (the stroke) between minimum and maximum of the difference signal 213, i.e., max(Phi1'-Phi2')-min(Phi1'-Phi2'). From FIG. 15 it is apparent that the stroke depends on the distance 151 between the magnetic angle sensors 101, 102. Because of this, it can be generally preferable to implement comparably large distances 151.

Figure 15:
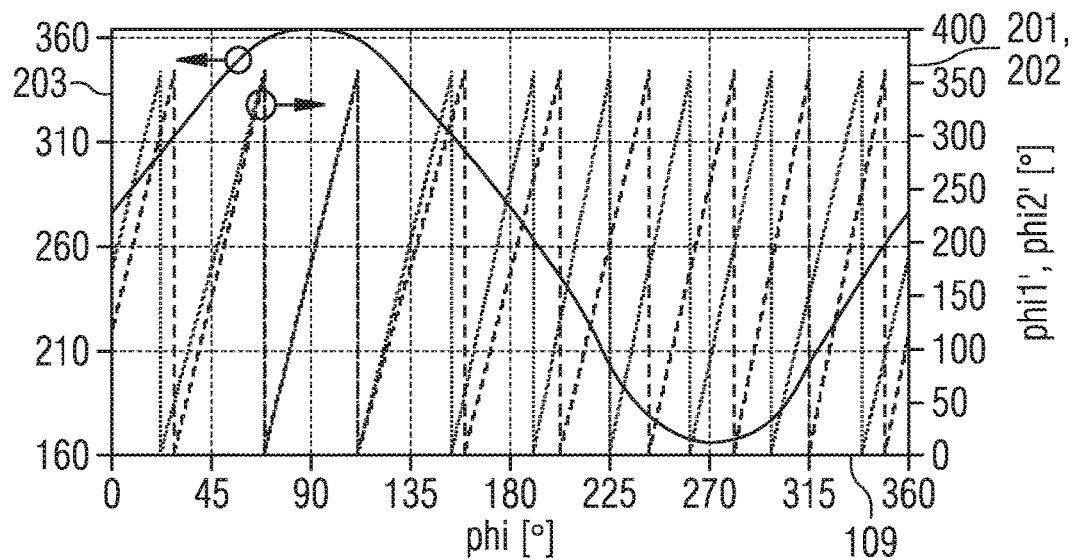
FIG. 15 illustrates schematically a difference between the first signal and the second signal for a given distance between the first magnetic angle sensor and the second magnetic angle sensor as a function of the relative positioning for the scenario of FIG. 5, wherein the difference has a dependency on the relative positioning which has a one-fold or two-fold ambiguity for different ranges.

FIG. 15 illustrates aspects with respect to the determining of the relative positioning 109. In FIG. 15, the magnetic angle sensors 101, 102 have a distance 151 amounting to 90° with respect to each other (see FIG. 10). The dimensions of the gaps 152, 152-1, 152-2 amount to 3.5 mm.

In FIG. 15, the first signal 201 and the second signal 202 are plotted (right-hand side axis) as measured by the magnetic angle sensors 101, 102 for different relative positions 109. Based on the first signal 201 and the second signal 202, the difference signal 203 may be determined. The difference signal 203 is indicative of the difference between the angles of the stray magnetic field 113 at the positions of the magnetic angle sensors 101, 102. It is possible to conclude on the relative positioning 109 based on the difference signal 203, e.g., based on a lookup table.

From FIG. 15 it is apparent that the dependency of the difference signal 203 on the relative positioning 109 does not have a one-fold ambiguity, i.e., is not unambiguously defined. In particular, the dependency of the difference signal 203 on the relative positioning 109 shows a two-fold ambiguity. It is possible to discriminate between the two alternative possibilities for the relative positioning 109 by taking into account that Phi1' is an odd function with respect to Phi=90°. If, e.g., one obtains Phi1'-Phi2'=360° for the difference signal, this corresponds to the two Phi values: 71.75° and 108.25°. Both are symmetrical with respect to 90°. It is possible to discriminate between these two values by considering Phi1'. This is the case because Phi1' is an odd function with respect to Phi=90°. I.e., in the present case: Phi1'=28.4° for Phi=71.75° and Phi1'=331.5° for Phi=108.25°. Thereby, it is possible to discriminate between the two relative positionings 109.

Figure 16:
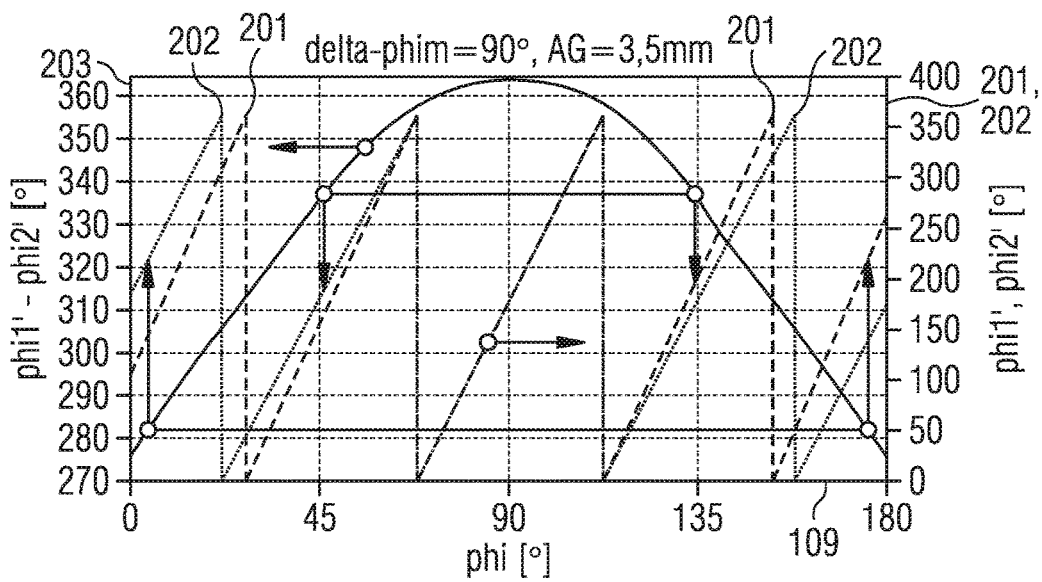
FIG. 16 illustrates schematically a difference between the first signal and the second signal for a given distance between the first magnetic angle sensor and the second magnetic angle sensor as a function of the relative positioning for the scenario FIG. 5, wherein the difference has a dependency on the relative positioning which has a two-fold ambiguitiy.

FIG. 16 is a blow-up of a detail of FIG. 15. From FIG. 16 it is apparent that for certain relative positionings 109 (illustrated by the vertical arrows in FIG. 16) the two-fold ambiguity as described above cannot be resolved unambiguously in the same manner as explained above. Phi1'-Phi2'=338° holds true for the relative positionings 109 at Phi=45° and Phi=135°: both times, phi1=315°. A respective situation occurs with the relative positionings 109 at phi=3° and phi=177°. In the range of 0° <phi<180°, additionally, the same number of corresponding situations is present.

To resolve this two-fold ambiguity, different techniques are conceivable. E.g., it would be possible to take into account a short-time trend of the signals 201, 202 in order to substantiate certain values. It would also be possible to provide a third magnetic angle sensor which is positioned remotely from the magnetic angle sensors 201, 202. It would be possible that this third magnetic angle sensor is used for resolving the two-fold ambiguity as described above. E.g., the third magnetic angle sensor could have the same distance from the first magnetic angle sensor 101 as from the second magnetic angle sensor 102. E.g., the third magnetic angle sensor could have a distance of 90° from the second magnetic angle sensor 102; the second magnetic angle sensor 102 could, in turn, have a distance 151 of 90° from the first magnetic angle sensor 101. Then, it is possible that the difference signals from pairs of those sensors are superimposed, e.g., phi3'-phi2' and phi2'-phi1'. Both curves are typically identical, but shifted with respect to each other. This shift can be used in order to resolve the two-fold ambiguity.

Figure 17:
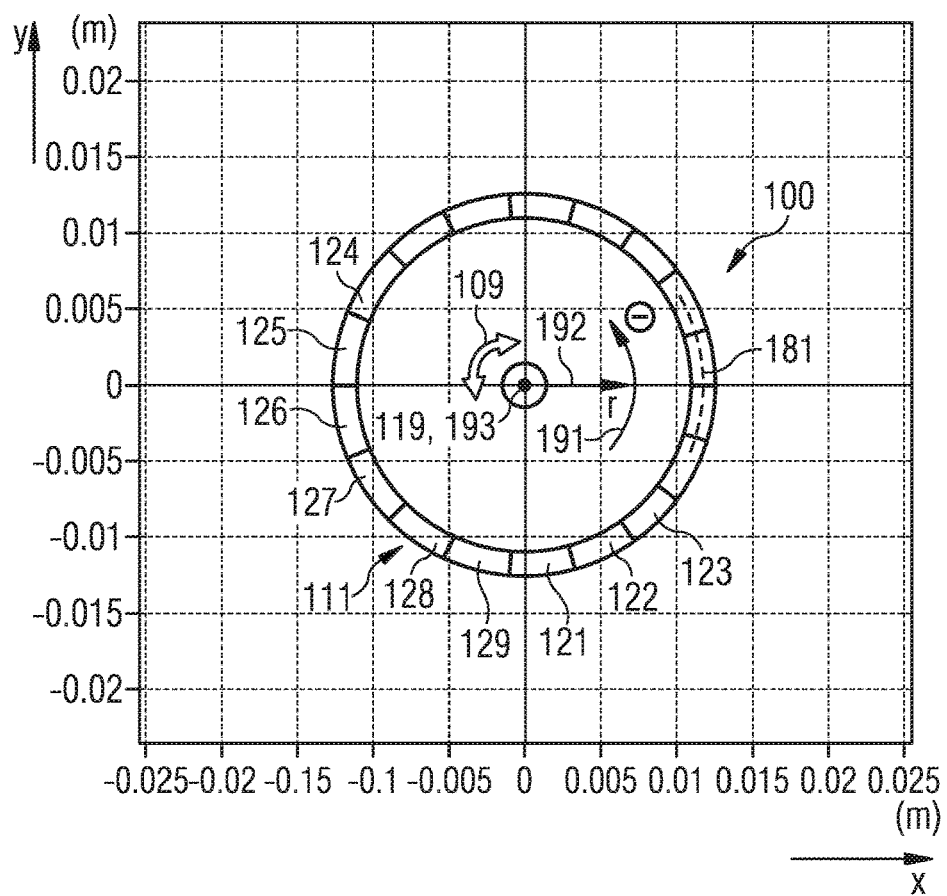
FIG. 17 illustrates schematically a device according to various embodiments, wherein the permanent magnetic material extends along a circular path.

FIG. 17 illustrates a further implementation of the device 100. In the example of FIG. 17, the poles 121-129 show monotonically increasing dimensions along the entire length of the path 181. I.e., the periodicity 115 monotonically increases along the entire length of the path 181. Starting at the pole 121, proceeding counterclockwise, the size of the poles is: 17°; Pole 122: 17,3187°; 17,6434°; 17,9742°; 18,3111°; 18,6544°; 19,0042°; 19,3604°; 19,7234°; 20,0932°; 20,4699°; 20,8536°; 21,2446°; 21,6429°; 22,0486°; 22,4620°; Pole 128: 22,8831°; Pole 129: 23,3121°.

Figure 18:
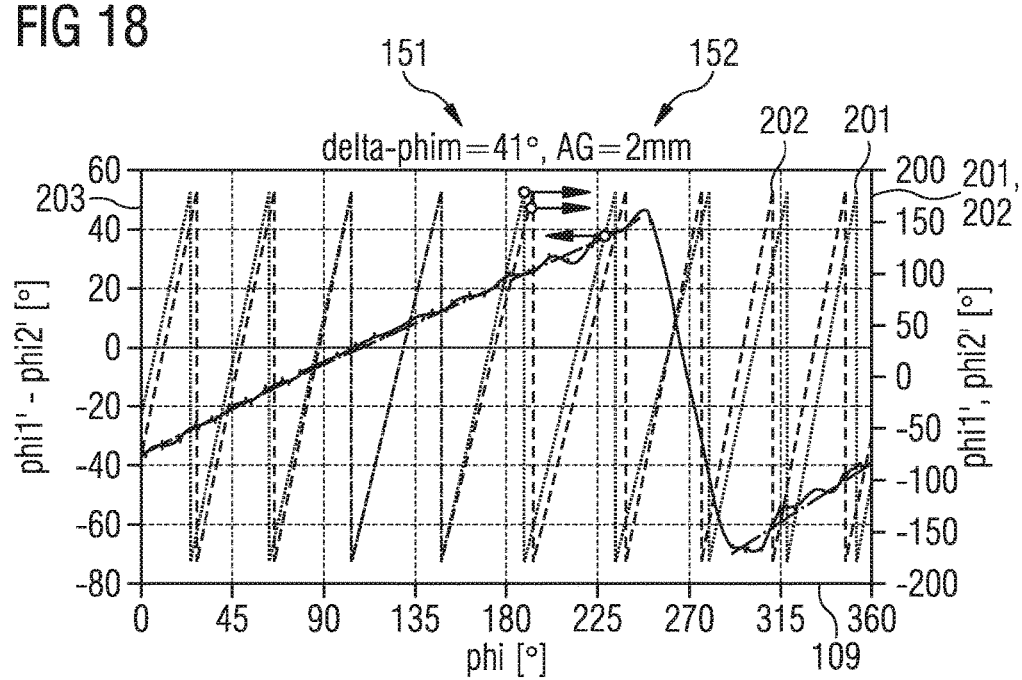
FIG. 18 illustrates schematically a difference between the first signal and the second signal for a given distance between the first magnetic angle sensor and the second magnetic angle sensor as a function of the relative positioning for the scenario of FIG. 17, wherein the difference has a dependency on the relative positioning which has a one-fold ambiguity in a given range.

FIG. 18 illustrates the first signal 201 (full line) and the second signal 202 (dashed line), as well as the difference signal 203 (dashed-dotted line) for the example of FIG. 17. In FIG. 18, the distance 151 of the magnetic angle sensors 101, 102 amounts to 41°. The dimensions of the gaps 152, 152-1, 152-2 amount to 2 mm.

From FIG. 18 it is apparent that the curve of the difference signal 203 shows a slope with positive inclinations in a larger range of relative positionings 109 if compared to the range of relative positionings 109 having a slope with negative inclinations. In such a case it would be possible to restrict operation of the device 100 to the range of a slope with positive inclinations, thereby avoiding a two-fold ambiguity of the dependency of the difference signal 203 on the relative positioning 109.

In further examples it would also be possible to use a plurality of magnetic materials along different paths 181 to resolve the two-fold ambiguity. E.g., it would be possible to use two multipole rings which are rotated by 180° with respect to each other. Then, the first revolution could be measured by means of the first multipole ring and a second revolution could be measured by means of the second multipole ring. The two multipole rings should have a sufficient distance with respect to each other in order to avoid interference between the stray magnetic fields.

Figure 19A:
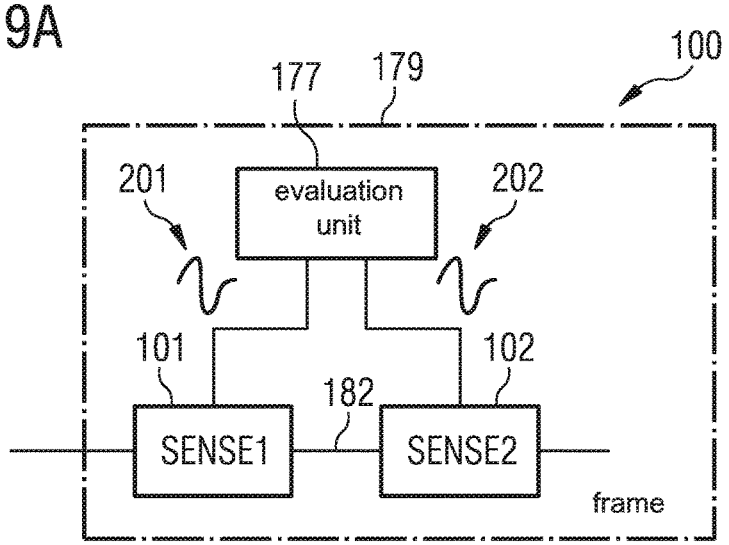
FIG. 19A illustrates schematically a device according to various embodiments.

FIG. 19A illustrates aspects with respect to a device 100 which comprises the first magnetic angle sensor 101, the second magnetic angle sensor 102, and the material 111. From FIG. 19A it is apparent that an evaluation unit 177 is configured to receive the first signal 201 from the first magnetic angle sensor 101 and to receive the second signal 202 from the second magnetic angle sensor 102. The evaluation unit 177 can then be configured to determine the relative positioning 109 of the magnetic angle sensors 101, 102 with respect to the material 111 based on the first signal 201 and based on the second signal 202. It can be advantageous to input two signals from magnetic angle sensor 101 and two signals from magnetic angle sensor 102 to the evaluation unit 177, respectively. E.g., magnetic angle sensor 101 can provide a cosine signal and a sine signal to the evaluation unit 177 such that the magnetic angle sensor 101 is not required to calculate the angle arctan2 (cosine signal, sine signal); thereby, calculation time and power consumption are reduced.

In the example of FIG. 19A, the evaluation unit 177 and the magnetic angle sensors 101, 102 are mounted to a frame 179 which is formed as a static device/stator. The relative positioning 109 is thus achieved by moving the material 111 along the path 181. In other examples it would also be possible that a synchronized movement of the magnetic angle sensors 101, 102 occurs along the path 182, alternatively or additionally to a movement of the material 111.

Figure 19B:
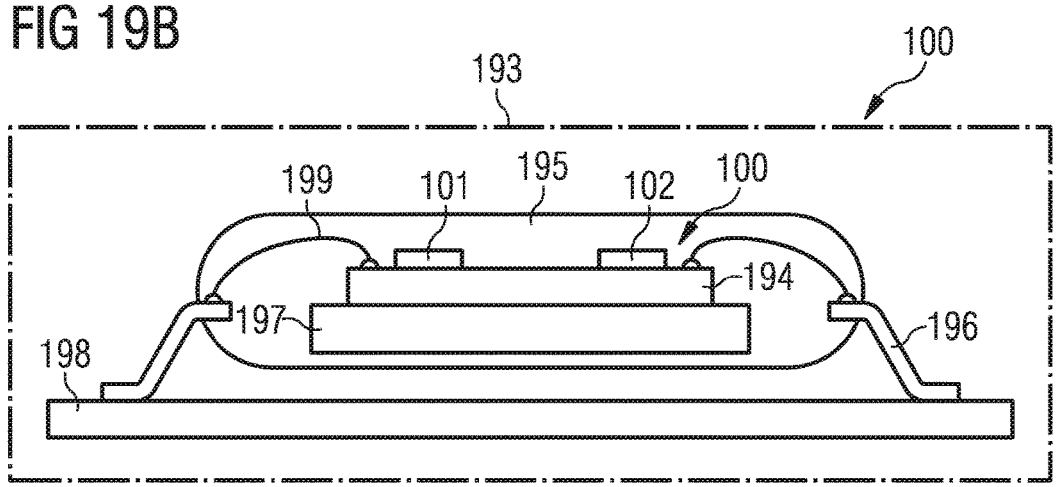
FIG. 19B illustrates schematically a housing and a plurality of substrates on which the magnetic angle sensors are positioned.

FIG. 19B illustrates the assembly of the magnetic angle sensors 101, 102 on a semiconductor substrate 194 which, in turn, is mounted on a leadframe 197 which provides, e.g., thermal coupling to a PCB board 198. The semiconductor chip 100 is placed within a housing 195 which can be fabricated, e.g., by overmolding. A die paddle 196 provides a coupling with bond wires 199 and connects the magnetic angle sensors 101, 102 with the PCB board 198. The entire PCB board 198, in turn, is positioned within an outer housing forming the part 193A.

In the example of FIG. 19B, the magnetic angle sensors 101, 102 are positioned on the same semiconductor substrate 194 and, therefore, within the same housing 195. Additionally, the magnetic angle sensors 101, 102 are provided on the same PCB board 198. In various examples it would also be possible that the magnetic angle sensors 101, 102 are provided on different semiconductor substrates 197 (i.e., on different chips) and/or different PCB boards 198 and/or in different housings 195, 193A.

By using a single housing 193A, 195, a simple and installation-space efficient implementation can be achieved. When using separate housings 193A, 195, a larger distance 151 between magnetic angle sensors 101, 102, and thereby a smoother difference signal 203, can be provided (cf. FIGS. 8-13). Corresponding considerations apply to the use of separated or shared substrates 194, 197, 198.

E.g., the distance 151 between the magnetic angle sensors 101, 102 can be in the range of 1 to 3 millimeters. If a large die paddle 197 is used, e.g., distances 151 of up to 50 millimeters with one and the same housing 195 and different substrates 194, 197 can be achieved.

Summarizing, above techniques have been described which enable to implement a magnetic position sensor at a high accuracy and using limited complexity of the employed hardware.

The various techniques have been discussed with respect to specific examples which are, however, not limiting. E.g., the various examples can show different dependencies of the periodicity 115 on the position along the path 181, see FIG. 20.

Figure 20:
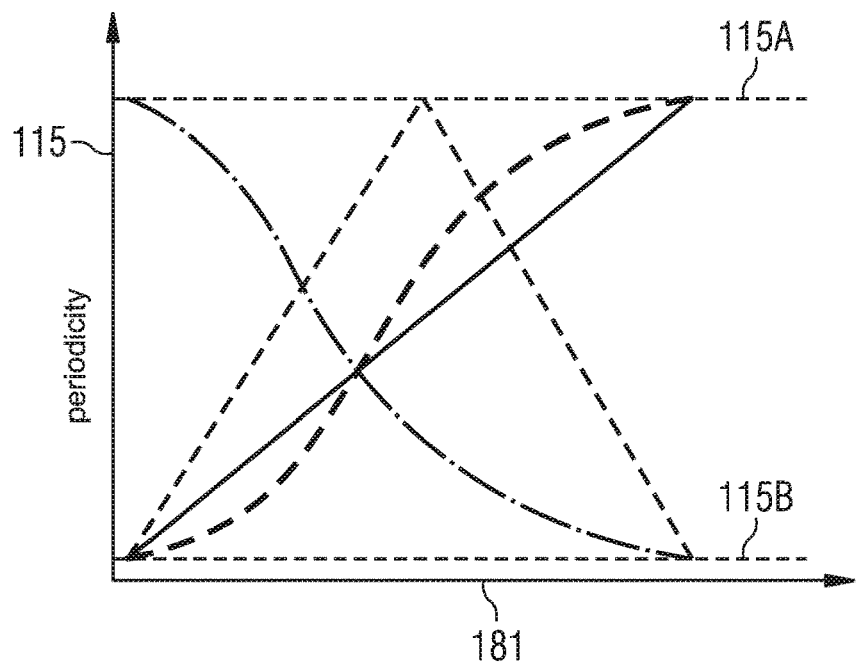
FIG. 20 illustrates schematically the variation of the periodicity of the magnetization of the material for various positions along the path.

FIG. 20 illustrates aspects with respect to the variation of the periodicity 115. In FIG. 20, for example dependencies of the periodicity 115 on the position along the path 181 are illustrated (full line; dashed line; dotted line; dotted-dashed line). From FIG. 20 it is apparent that in various examples it is possible that the periodicity 115 monotonically increases or decreases along the entire path 181, i.e., between a starting point and an end point of the path 181. It would also be possible, however, that the periodicity 115 has the same sign of inclination only in specific parts of the path 181 (dotted line in FIG. 20).

From FIG. 20 it is also apparent that the periodicity 115 in the area of the magnetic angle sensors 101, 102 can vary for different relative positionings 109. This is because the movement can occur along the path 181.

In FIG. 20, the dependency of the periodicity 115 on the position along the path 181 is qualitatively illustrated. In quantitative terms, a variation in the periodicity 115 along the path 181 by a factor of 1.05-3 can be preferable. It is thus possible that the ratio between the maximum 115A of the periodicity 115 at the minimum 115B of the periodicity 115 is in the range of 1.05-3. Thereby, a good trade-off between a large amplitude of the difference signal 203 on the one hand side and a limited variation of the amplitude of the stray magnetic field 113 on the other hand side can be achieved. Thereby, the relative positioning 109 can be determined at a high accuracy.

Various examples as described above have been discussed with respect to scenarios where the dimensions of the gaps 152-1, 152-2 between the material 111 and the magnetic angle sensors 101, 102 remain constant for movement and for different relative positionings 109. It is also possible that the dimensions of the gaps 152-1, 152-2 show a dependency on the relative positioning 109. Such a scenario is illustrated in FIG. 21.

Figure 21:
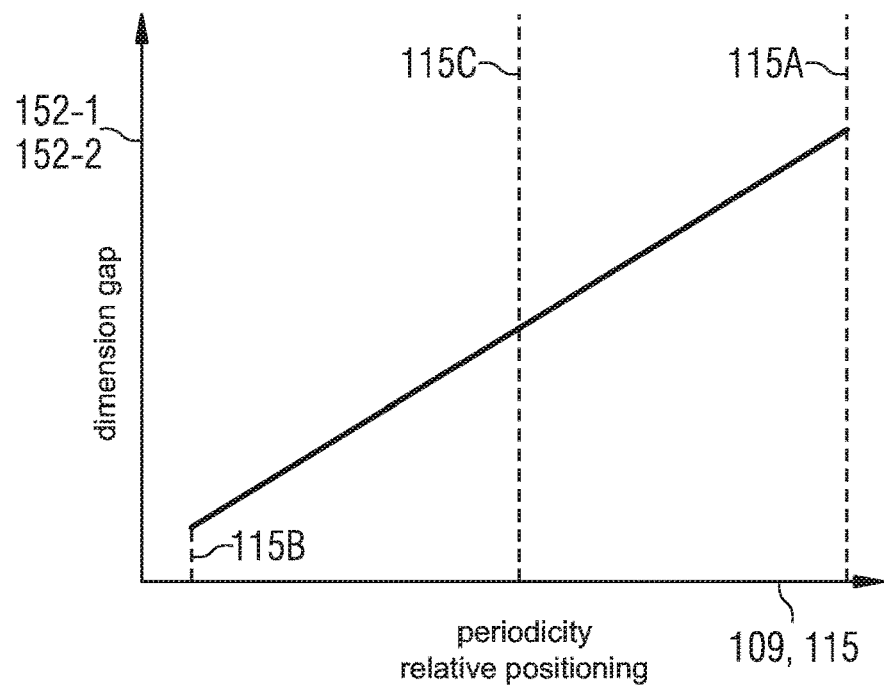
FIG. 21 illustrates schematically the variation of the dimensions of a gap perpendicular to the path and between the material and the magnetic angle sensors as a function of the periodicity.

In FIG. 21, a scenario is disclosed in which the dimension of the respective gap 152-1, 152-2 correlates with the periodicity 115 of the magnetization 112 in the respectively neighboring area of the material 111.

While above various examples have been described in which the dimension of the respective gap 152-1, 152-2 between the material 111 and the magnetic angle sensors 101, 102 are the same, it is, however, also possible that the gaps have different dimensions 152-1, 152-2. Because the signals 201, 202 are indicative of the orientation of the stray magnetic field 113, It is also possible to determine the relative positioning 109 for such scenarios. A potentially deviating amplitude can be compensated.

In FIG. 21, the dimension of the gaps 152-1, 152-2 is qualitatively shown with respect to the periodicity 115. Quantitatively, the dimension of the gaps 152-1, 152-2 and the periodicity 115 may be of same order of magnitude. E.g., the first gap 152-1 and/or the second gap 152-2 may have dimensions in the order of the average 115C of the periodicity 115, multiplied by a factor of 0.1 to 2. By means of such a dimensioning, on the one hand side, a sufficiently large amplitude of the stray magnetic field 113 can be achieved; thereby, a good signal-to-noise-ratio can be ensured. On the other hand, non-harmonic contributions to the spatial dependency of the stray magnetic field—cf. FIGS. 8-13—can be reduced. Thereby, a particularly high accuracy when determining the relative positioning 109 may be achieved.

Figure 22:
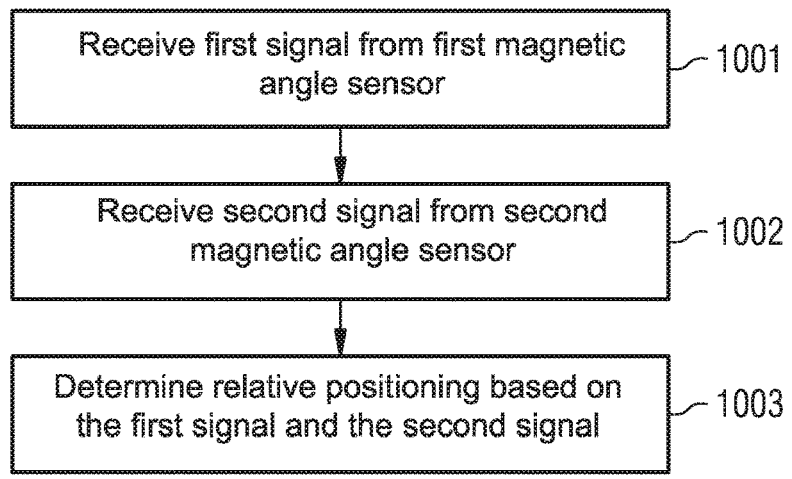
FIG. 22 is a flowchart of a method according to various embodiments.

FIG. 22 is a flowchart of a method according to various embodiments. First, at 1001, the first signal 201 is received from the first magnetic angle sensor 101. The first signal 201 is indicative of the first angle of the stray magnetic field 113 at the position of the first magnetic angle sensor 101.

Then, at 1002, the second signal 202 is received from the second magnetic angle sensor 102. The second signal 202 is indicative of the second angle of the stray magnetic field 113 at the position of the second magnetic angle sensor 102.

At 1003, the relative positioning 109 is determined based on the first signal 201 and based on the second signal 202. E.g., at 1003, the difference signal 203 between the first signal 201 and the second signal 202 may be determined by subtraction. E.g., at 1003, a lookup table can be used to determine the relative positioning 109 based on the difference signal 203.

Figure 23:
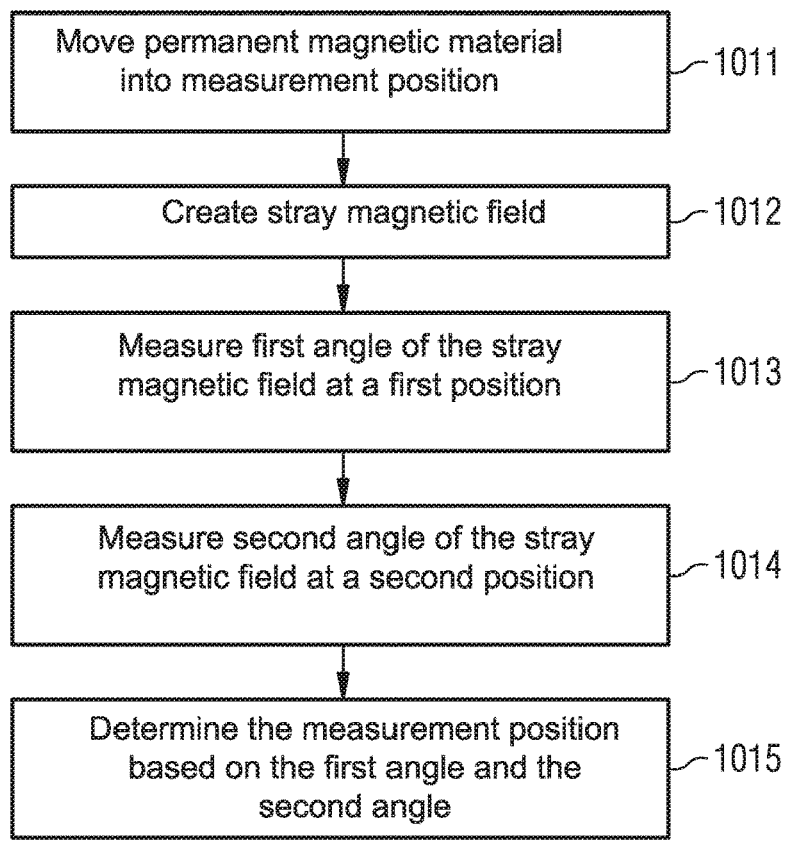
FIG. 23 is a flowchart of a method according to various embodiments.

FIG. 23 is a flowchart of a method according to various embodiments. First, at 1011, a permanent magnetic material 111 is moved into a measurement position. The measurement position can correspond to a specific relative positioning 109 between the magnetic angle sensors 101, 102 and the material 111. At 1012, the stray magnetic field 113 is created.

At 1013, at least one first signal is measured which is indicative of the first angle the stray magnetic field 113 at a first position. For this, it is possible to use the first magnetic angle sensor 101. At 1014, the second angle of the stray magnetic field 113 is measured at a second position which is positioned remotely from the first position. E.g., the second angle of the stray magnetic field 113 can be measured by the second magnetic angle sensor 102 based on at least a second signal.

At 1015, determining of the measurement position based on the first angle and the second angle is performed.

Various features of the embodiments and aspects of the disclosure described above can be combined with each other. In particular, features cannot only be used in the explicitly identified combination, but also in other combinations or used in isolation without departing from the scope of the disclosure.

What is claimed is:

1. A device, comprising:
    a permanent magnetic material which extends along a path and comprises a plurality of alternating magnetic poles,
    a first magnetic angle sensor configured to output at least one first signal, the first magnetic angle sensor being positioned remotely from the permanent magnetic material,
    a second magnetic angle sensor configured to output at least one second signal, the second magnetic angle sensor being positioned remotely from the permanent magnetic material and from the first magnetic angle sensor, and
    an evaluation unit comprising hardware, software, or a combination of hardware and software, wherein the evaluation unit is configured to determine a relative positioning of the first magnetic angle sensor and the second magnetic angle sensor with respect to the permanent magnetic material parallel to the path based on the at least one first signal and the at least one second signal,
    wherein a magnetization of the permanent magnetic material has a periodicity which varies along the path according to respective increases or decreases monotonically in sizes of the plurality of alternating magnetic poles along the path.

2. The device of claim 1, wherein a polarity of the magnetization changes between neighboring poles, and wherein an orientation of the magnetization of the permanent magnetic material rotates within at least one of the poles.

3. The device of claim 1, wherein the periodicity monotonically increases or decreases along the path for at least three periods.

4. The device of claim 1, wherein a measure of a difference between the orientation of a stray magnetic field of the magnetization of the permanent magnetic material at the position of the first magnetic angle sensor and the orientation of the stray magnetic field of the magnetization at the position of the second magnetic angle sensor has dependency on the relative positioning with one-fold or two-fold ambiguity.

5. The device of claim 1, wherein the evaluation unit is configured to determine the relative positioning based on a difference between the at least one first signal and the at least one second signal.

6. The device of claim 1, wherein the path is linear and wherein the permanent magnetic material is positioned on a linear carrier which extends in parallel to the path.

7. The device of claim 1,
wherein the path is circular,
wherein the permanent magnetic material is positioned close to the surface of a cylindrical carrier, and
wherein the first magnetic angle sensor and the second magnetic angle sensor are respectively positioned remotely from the surface of the cylindrical carrier in radial direction.

8. The device of claim 1,
wherein the path is circular,
wherein the permanent magnetic material is positioned on a circular disk carrier, and
wherein the first magnetic angle sensor and the second magnetic angle sensor are respectively positioned remotely from a perimeter of the circular disk carrier in axial direction.

9. The device of claim 1,
wherein the path is circular,
wherein the permanent magnetic material is positioned on a carrier,
wherein the carrier is positioned rotatably with respect to the first magnetic angle sensor and with respect to the second magnetic angle sensor and around a rotational axis in order to vary the relative positioning, and
wherein the rotational axis is eccentrically positioned with respect to a center point of the circular path.

10. The device of claim 1, wherein the path is elliptical.

11. The device of claim 1, further comprising:
a frame which is formed as a static element of the device, and
a carrier on which the permanent magnetic material is positioned,
wherein either the first magnetic angle sensor and the second magnetic angle sensor, or the carrier with the permanent magnetic material are coupled fixedly to the frame.

12. The device of claim 1,
wherein the first magnetic angle sensor and the second magnetic angle sensor are movably positioned parallel to a further path and with respect to the permanent magnetic material, and
wherein a distance between the first magnetic angle sensor and the second magnetic angle sensor parallel to the further path is larger than the minimum of the periodicity.

13. The device of claim 1, wherein a ratio between the maximum of the periodicity and the minimum of the periodicity lies within the range of 1.05-3.

14. The device of claim 1, wherein a dimension of a first gap perpendicular to the path and between the permanent magnetic material and the first magnetic angle sensor, as well as a dimension of a second gap perpendicular to the path and between the permanent magnetic material and the second magnetic angle sensor vary as a function of the relative positioning according to a variation of the periodicity.

15. The device of claim 1,
wherein a dimension of a first gap perpendicular to the path and between the permanent magnetic material and the first magnetic angle sensor has a first value at a first relative positioning and has a second value at a second relative positioning, the second value being larger than the first value,
wherein the first relative positioning corresponds to a position of the first magnetic angle sensor neighboring to the permanent magnetic material in an area of a first periodicity, and
wherein the second relative positioning corresponds to a position of the first magnetic angle sensor neighboring to the permanent magnetic material in an area of a second periodicity, the second periodicity being larger than the first periodicity.

16. The device of claim 1, wherein a dimension of a first gap perpendicular to the path and in between the permanent magnetic material and the first magnetic angle sensor, as well as a dimension of a second gap perpendicular to the path and in between the permanent magnetic material and the second magnetic angle sensor remain constant as a function of the relative positioning.

17. The device of claim 1,
wherein a dimension of a first gap perpendicular to the path and between the permanent magnetic material and the first magnetic angle sensor fulfills at least one of the following criteria:
in the range of an average of the periodicity multiplied by 0.1-2;
in the range of an average of the periodicity multiplied by 0.2-1; and/or
wherein a dimension of a second gap perpendicular to the path and in between the permanent magnetic material and the second magnetic angle sensor fulfills at least one of the following criteria:
in the range of an average of the periodicity multiplied by 0.1-2;
in the range of an average of the periodicity multiplied by 0.2-1.

18. The device of claim 1,
wherein the magnetization of the permanent magnetic material has North poles and South poles arranged adjacent to each other along the path, and
wherein an orientation of the magnetization of the permanent magnetic material has a component perpendicular to the path at the North poles and at the South poles.

19. The device of claim 1, wherein an orientation of the magnetization of the permanent magnetic material varies along the path in a zig-zag shape.

20. The device of claim 1, wherein a component of the magnetization of the permanent magnetic material which is perpendicular to the path is described by a Halbach-shape as a function of the position along the path.

21. The device of claim 1,
wherein an orientation of the magnetization of the permanent magnetic material varies step-wise or continuously along the path.

22. The device of claim 1, further comprising:
at least one housing, wherein the first magnetic angle sensor and the second magnetic angle sensor are positioned in the at least one housing.

23. The device of claim 1, further comprising:
at least one substrate, wherein the first magnetic angle sensor and the second magnetic angle sensor are positioned on the at least one substrate.

24. A method, comprising:
receiving at least one first signal from a first magnetic angle sensor which is positioned remotely from a permanent magnetic material,
receiving at least one second signal from a second magnetic angle sensor which is positioned remotely from the permanent magnetic material and from the first magnetic angle sensor,
wherein the permanent magnetic material extends along a path and comprises a plurality of alternating magnetic poles, and
based on the at least one first signal and on the at least one second signal:
determining a relative positioning of the first magnetic angle sensor and of the second magnetic angle sensor with respect to the permanent magnetic material parallel to the path,
wherein the magnetization of the permanent magnetic material has a periodicity which varies along the path according to respective increases or decreases monotonically in sizes of the plurality of alternating magnetic poles along the path.

25. A method, comprising:
moving a permanent magnetic material along a path to a measurement position, the permanent magnetic material extending along the path and comprising a plurality of alternating magnetic poles,
at least in the measurement position: creating a stray magnetic field by the permanent magnetic material, wherein the stray magnetic field varies along a further path with a periodicity that varies along the further path according to respective increases or decreases monotonically in sizes of the plurality of alternating magnetic poles along the further path,
measuring a first observable which is indicative of a first angle of the stray magnetic field at a first position along the further path,
measuring a second observable which is indicative of a second angle of the stray magnetic field at a second position along the further path, and
determining the measurement position based on the first observable and the second observable.

* * * * *